(12) United States Patent
Du et al.

(10) Patent No.: US 12,651,627 B2
(45) Date of Patent: Jun. 9, 2026

(54) PERIPHERAL STRUCTURE ARRANGEMENTS OF MEMORY DEVICES AND METHODS FOR FORMING THE SAME

(71) Applicant: YANGTZE MEMORY TECHNOLOGIES CO., LTD., Wuhan (CN)

(72) Inventors: Zhichao Du, Wuhan (CN); Yu Wang, Wuhan (CN); Daesik Song, Wuhan (CN); Xu Hou, Wuhan (CN); Danyang Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 158 days.

(21) Appl. No.: 18/234,333

(22) Filed: Aug. 15, 2023

(65) Prior Publication Data

US 2024/0221819 A1 Jul. 4, 2024

Related U.S. Application Data

(63) Continuation of application No. PCT/CN2023/109534, filed on Jul. 27, 2023.

(60) Provisional application No. 63/436,430, filed on Dec. 30, 2022.

(51) Int. Cl.
*G11C 11/408* (2006.01)
*G11C 11/4091* (2006.01)

(52) U.S. Cl.
CPC ...... *G11C 11/4085* (2013.01); *G11C 11/4087* (2013.01); *G11C 11/4091* (2013.01)

(58) Field of Classification Search
None
See application file for complete search history.

(56) References Cited

U.S. PATENT DOCUMENTS

| | | | |
|---|---|---|---|
| 2020/0083229 A1 | 3/2020 | Kim et al. | |
| 2020/0185370 A1 | 6/2020 | Juengling | |
| 2021/0143142 A1 | 5/2021 | Fujisawa et al. | |
| 2022/0328087 A1 | 10/2022 | Bedeschi | |
| 2022/0343971 A1* | 10/2022 | Park | H10B 12/315 |
| 2024/0155831 A1* | 5/2024 | Choi | H10B 12/482 |
| 2024/0170042 A1* | 5/2024 | Yang | G11C 11/4074 |

FOREIGN PATENT DOCUMENTS

| | | |
|---|---|---|
| JP | 2011165240 A | 8/2011 |
| JP | 2019049013 A | 3/2019 |

OTHER PUBLICATIONS

International Search Report issued in corresponding International Application No. PCT/CN2023/109534, mailed on Jan. 16, 2024, 3 pages.

* cited by examiner

*Primary Examiner* — Alfredo Bermudez Lozada
(74) *Attorney, Agent, or Firm* — BAYES PLLC

(57) ABSTRACT

A memory device includes a memory array structure and a peripheral structure. The memory array structure includes at least one memory bank, and each memory bank includes a plurality of memory blocks. The peripheral structure includes a word line driver circuit and a sense amplifier circuit. A first area including the word line driver circuit and the sense amplifier circuit at least partially overlaps a second area including a memory block in a plan view of the memory device.

19 Claims, 19 Drawing Sheets

600

100

101

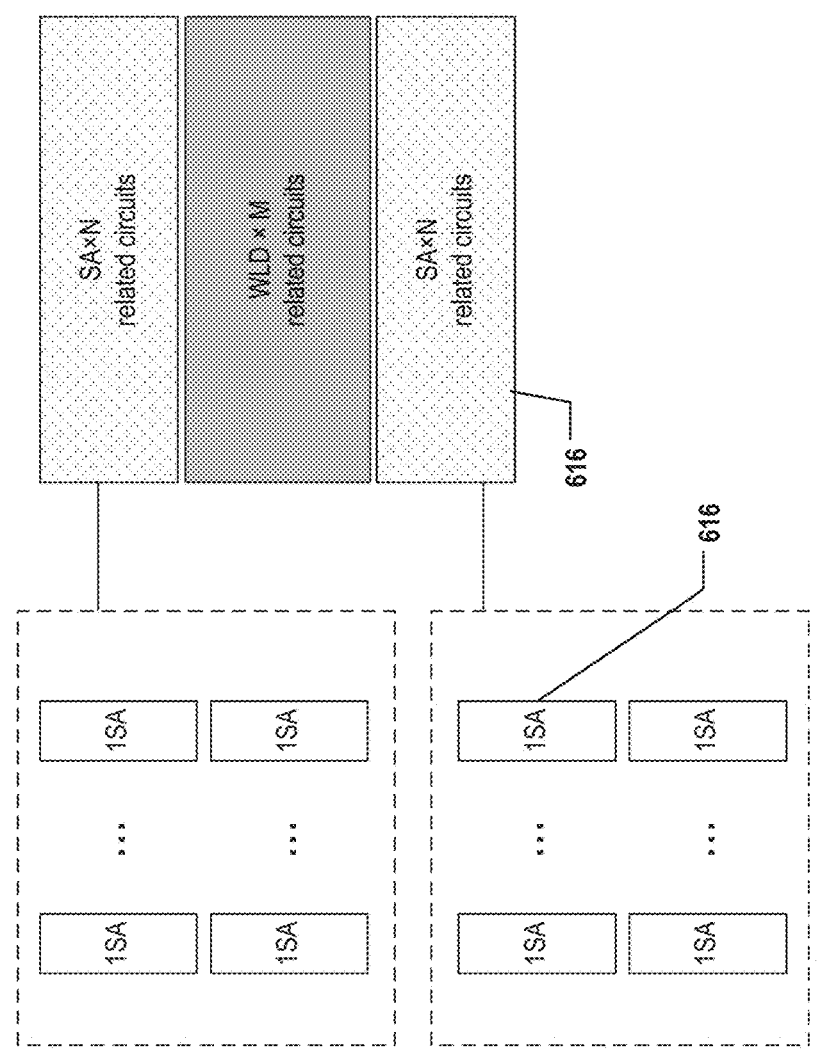
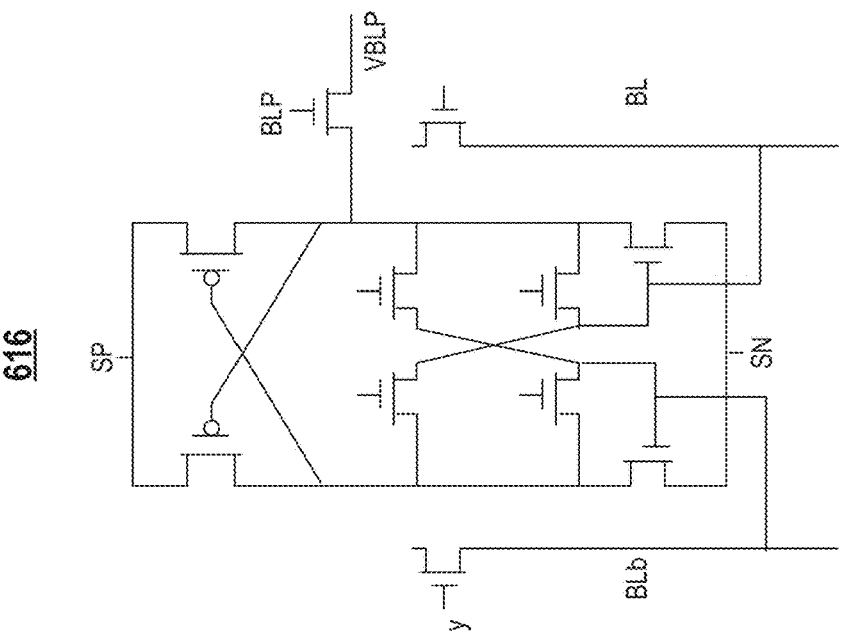
FIG. 9

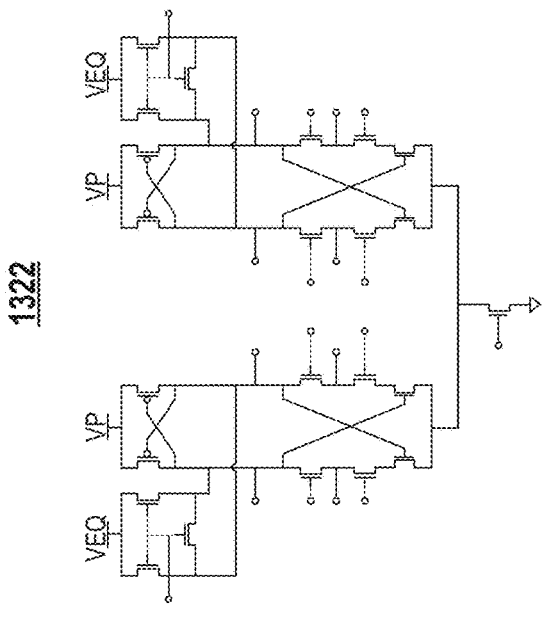
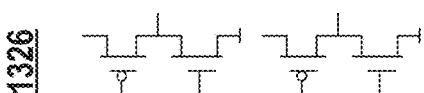
1322
1326
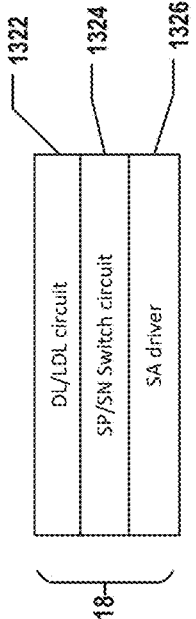
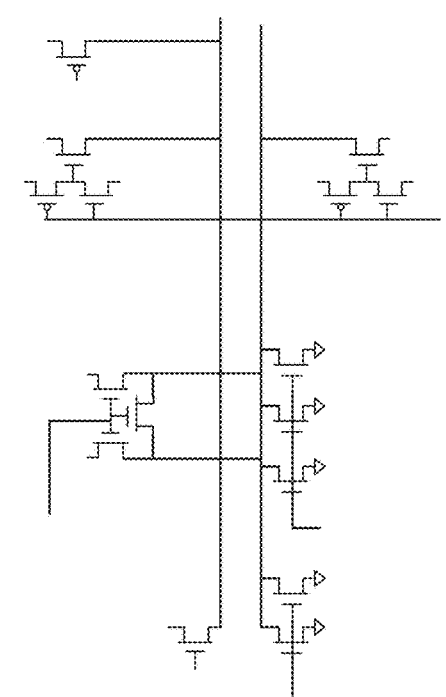
FIG. 14

<u>1800</u>

Forming a memory array structure on a first substrate, the memory array structure including at least one memory bank, each memory bank including a plurality of memory blocks Forming a peripheral structure on a second substrate different from the first substrate, the peripheral structure including a word line driver circuit and a sense amplifier circuit Bonding the memory array structure and the peripheral structure to have the word line driver circuit and the sense amplifier circuit at least partially overlap a memory block in a plan view of the memory device

PERIPHERAL STRUCTURE ARRANGEMENTS OF MEMORY DEVICES AND METHODS FOR FORMING THE SAME

CROSS-REFERENCE TO RELATED APPLICATIONS

This application is a continuation of International Application No. PCT/CN2023/109534, filed on Jul. 27, 2023, which claims the benefit of priority to U.S. Provisional Application No. 63/436,430, filed on Dec. 30, 2022, both of which are hereby incorporated by reference in their entireties.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a memory device is disclosed. The memory device includes a memory array structure and a peripheral structure. The memory array structure includes at least one memory bank, and each memory bank includes a plurality of memory blocks. The peripheral structure includes a word line driver circuit and a sense amplifier circuit. A first area including the word line driver circuit and the sense amplifier circuit at least partially overlaps a second area including a memory block in a plan view of the memory device.

In some implementations, the first area includes a first subarea including the word line driver circuit and a second subarea including the sense amplifier circuit. The first subarea and the second subarea are alternately arranged in the first area.

In some implementations, the first area includes two first subareas and two second subareas. Two first subareas are disposed on diagonal corners in the first area, and two second subareas are disposed on diagonal corners in the first area.

In some implementations, the first area completely overlaps the second area in the plan view of the memory device.

In some implementations, the word line driver circuit in one of the two first subareas is coupled to odd word lines in the memory block, and the word line driver circuit in the other of the two first subarea is coupled to even word lines in the memory block.

In some implementations, the first area includes a first subarea including the word line driver circuit and two second subareas each including the sense amplifier circuit. The two second subareas are disposed on two sides of the first subarea.

In some implementations, the sense amplifier circuit in one of the two second subareas is shared by two adjacent memory blocks.

In some implementations, the sense amplifier circuit in the two second subareas is coupled to word lines in the memory block.

In some implementations, the sense amplifier circuit in one of the two second subareas is coupled to odd word lines in the memory block and odd word lines in a first adjacent memory block, and the sense amplifier circuit in the other of the two second subareas is coupled to even word lines in the memory block and even word lines in a second adjacent memory block.

In some implementations, the word line driver circuit in the first subarea is coupled to odd word lines or even word lines in the memory block.

In some implementations, the word line driver circuit in the first subarea is coupled to odd word lines or even word lines in adjacent memory blocks.

In some implementations, the first area includes a first subarea including the word line driver circuit, a second subarea including the sense amplifier circuit, and a third subarea including a decoder circuit. The first subarea is disposed between adjacent memory blocks in the plan view of the memory device, and the second subarea and the third subarea overlap the second area of the memory block in the plan view of the memory device.

In some implementations, the first area further includes a fourth subarea including a control circuit for the sense amplifier circuit, and the fourth subarea is disposed between the second subarea and the third subarea.

In some implementations, the second subarea, the third subarea, and the fourth subarea overlap the second area of the memory block in the plan view of the memory device.

In some implementations, the first area includes a first subarea including the word line driver circuit and two second subareas each including the sense amplifier circuit. The first subarea is disposed between adjacent memory blocks in the plan view of the memory device, and the two second subareas overlap the second area of the memory block in the plan view of the memory device.

In some implementations, the first area further includes a third subarea including a control circuit for the sense amplifier circuit, and the third subarea is disposed between the two second subareas.

In some implementations, the memory array structure is disposed on a first substrate, and the peripheral structure is disposed on a second substrate different from the first substrate.

In some implementations, the memory array structure disposed on the first substrate is bonded with the peripheral structure disposed on the second substrate.

In some implementations, the memory array structure includes dynamic random access memory (DRAM).

In another aspect, a memory device is disclosed. The memory device includes a memory array structure and a peripheral structure. The memory array structure is disposed on a first substrate including at least one memory bank, and each memory bank including a plurality of memory blocks. The peripheral structure is disposed on a second substrate different from the first substrate including a sense amplifier circuit and a word line driver circuit. The sense amplifier circuit overlaps a memory block in a plan view of the memory device.

In some implementations, the word line driver circuit is disposed between adjacent memory blocks in the plan view of the memory device.

In some implementations, the peripheral structure further includes a decoder circuit overlapping the memory block in the plan view of the memory device.

In some implementations, the peripheral structure further includes a control circuit for the sense amplifier circuit overlapping the memory block in the plan view of the memory device.

In some implementations, the word line driver circuit overlaps the memory block in the plan view of the memory device.

In some implementations, the sense amplifier circuit includes a first subarea and a second subarea disposed on two sides of the word line driver circuit in the plan view of the memory device.

In some implementations, the sense amplifier circuit includes a first subarea and a second subarea, and the word line driver circuit includes a third subarea and a fourth subarea. The first subarea and the third subarea are disposed on diagonal corners overlapping the memory block in the plan view of the memory device, and the second subarea and the fourth subarea are disposed on diagonal corners overlapping the memory block in the plan view of the memory device.

In some implementations, the memory array structure includes dynamic random access memory (DRAM).

In still another aspect, a method for forming a memory device is disclosed. A memory array structure is formed on a first substrate. The memory array structure includes at least one memory bank, and each memory bank includes a plurality of memory blocks. A peripheral structure is formed on a second substrate different from the first substrate. The peripheral structure includes a word line driver circuit and a sense amplifier circuit. The memory array structure and the peripheral structure are bonded to have the word line driver circuit and the sense amplifier circuit at least partially overlap a memory block in a plan view of the memory device.

In some implementations, the word line driver circuit is formed in a first subarea, and the sense amplifier circuit is formed in a second subarea.

In some implementations, the first subarea and the second subarea are disposed on diagonal corners of the memory block in the plan view of the memory device.

In some implementations, the word line driver circuit is formed in a first subarea, and the sense amplifier circuit is formed in a second subarea and a third subarea.

In some implementations, the second subarea and the third subarea are disposed on two sides of the first subarea in the plan view of the memory device.

In some implementations, the first subarea is disposed between adjacent memory blocks in the plan view of the memory device, and the second subarea and the third subarea overlap the memory block in the plan view of the memory device.

In some implementations, the word line driver circuit is formed in a first subarea, the sense amplifier circuit is formed in a second subarea, and a decoder circuit is formed in a third subarea.

In some implementations, the first subarea is disposed between adjacent memory blocks in the plan view of the memory device, and the second subarea and the third subarea overlap the memory block in the plan view of the memory device.

In yet another aspect, a system is disclosed. The system includes a memory device and a memory controller coupled to the memory device. The memory device includes a memory array structure and a peripheral structure. The memory array structure includes at least one memory bank, and each memory bank includes a plurality of memory blocks. The peripheral structure includes a word line driver circuit and a sense amplifier circuit. A first area including the word line driver circuit and the sense amplifier circuit at least partially overlaps a second area including a memory block in a plan view of the memory device. The memory controller is configured to control operations of the memory array structure through the peripheral structure.

In yet another aspect, a system is disclosed. The system includes a memory device and a memory controller coupled to the memory device. The memory device includes a memory array structure and a peripheral structure. The memory array structure is disposed on a first substrate including at least one memory bank, and each memory bank including a plurality of memory blocks. The peripheral structure is disposed on a second substrate different from the first substrate including a sense amplifier circuit and a word line driver circuit. The sense amplifier circuit overlaps a memory block in a plan view of the memory device. The memory controller is configured to control operations of the memory array structure through the peripheral structure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 9 illustrates a schematic view of a sense amplifier circuit of a memory device, according to some aspects of the present disclosure.

FIG. 14 illustrates a schematic view of a conjunction circuit of a memory device, according to some aspects of the present disclosure.

FIG. 18 illustrates a flowchart of a method for forming a memory device, according to some aspects of the present disclosure.

Figure 1A:
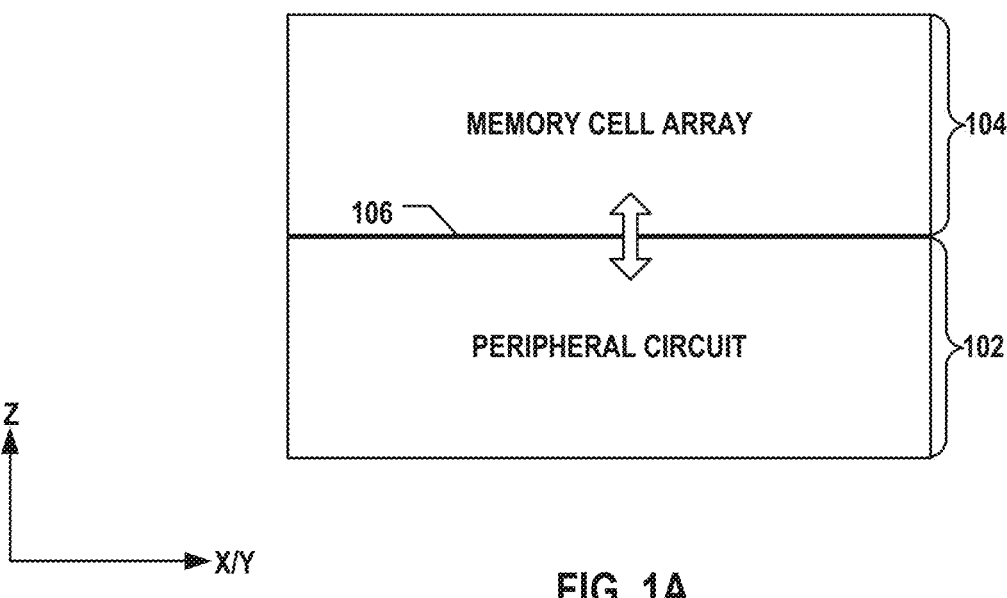
FIG. 1A illustrates a schematic view of a cross-section of a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

On the other hand, the memory cell array and the peripheral circuits for controlling the memory cell array are usually arranged side-by-side in the same plane. As the number of memory cells keeps increasing, to maintain the same chip size, the dimensions of the components in the memory cell array, such as transistors, word lines, and/or bit lines, need to keep decreasing in order not to significantly reduce the memory cell array efficiency.

To address one or more of the aforementioned issues, the present disclosure introduces a solution in which vertical transistors replace the planar transistors as the switch and selecting devices in a memory cell array of memory devices (e.g., DRAM, PCM, and FRAM). Compared with planar transistors, the vertically arranged transistors (e.g., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and on below the transistors), such that the process margin of the bit lines can be increased and the coupling capacitance between the bit lines and the storage units can be decreased.

Consistent with the scope of the present disclosure, according to some aspects of the present disclosure, the memory cell array having vertical transistors and the peripheral circuits of the memory cell array can be formed on different wafers and bonded together in a face-to-face manner. Thus, the thermal budget for fabricating the memory cell array does not affect the fabrication of the peripheral circuits. The stacked memory cell array and peripheral circuits can also reduce the chip size compared with the side-by-side arrangement, thereby improving the array efficiency. In some implementations, more than one memory cell array is stacked over one another using bonding techniques to further increase the array efficiency. In some implementations, the word lines and bit lines are disposed close to the bonding interface due to the vertically arranged transistors, which can be coupled to the peripheral circuits through a large number (e.g., millions) of parallel bonding contacts across the bonding interface can make direct, short-distance (e.g., micron-level) electrical connections between the memory cell array and peripheral circuits to increase the throughput and input/output (I/O) speed of the memory devices.

In some implementations, the vertical transistors disclosed herein include multi-gate transistors (e.g., gate-all-around (GAA) transistors, tri-gate transistors, or double-gate transistors), which can have a larger gate control area to achieve better channel control with a smaller subthreshold swing. Since the channel is fully depleted, the leakage current of multi-gate transistors can be significantly reduced as well. Thus, using multi-gate transistors instead of planar transistors can achieve a much better speed (saturated drain current)/leakage current performance.

In some implementations, the vertical transistors disclosed herein include single-gate transistors (a.k.a. single-side gate transistors) in a mirror-symmetric arrangement with respect to adjacent transistors in the bit line direction as a result of splitting multi-gate transistors (e.g., double-gate transistors) using trench isolations extending along the word line direction. Thus, the memory cell density in the bit line direction can be significantly increased (e.g., doubled) without unduly complicating the fabrication process compared with using processes, such as self-aligned double patterning (SADP). Also, the mirror-symmetric single-gate transistors have a larger process window for word line, bit line, and transistor pitch reduction, compared to either planar transistors or multi-gate vertical transistors, for example, with dual-side or all-around gates.

FIG. 1A illustrates a schematic view of a cross-section of a memory device 100, according to some aspects of the present disclosure. Memory device 100 represents an example of a bonded chip. The components of memory device 100 (e.g., memory cell array and peripheral circuits) can be formed separately on different substrates and then jointed to form a bonded chip. Memory device 100 can include a first semiconductor structure 102 including the peripheral circuits of a memory cell array. Memory device 100 can also include a second semiconductor structure 104 including the memory cell array. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first semiconductor structure 102 use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 1A, memory device 100 can also include second semiconductor structure 104 including an array of memory cells (memory cell array) that can use transistors as the switch and selecting devices. In some implementations, the memory cell array includes an array of DRAM cells. For ease of description, a DRAM cell array may be used as an example for describing the memory cell array in the present disclosure. But it is understood that the memory cell array is not limited to DRAM cell array and may include any other suitable types of memory cell arrays that can use transistors as the switch and selecting devices, such as PCM cell array, static random-access memory (SRAM) cell array, FRAM cell array, resistive memory cell array, magnetic memory cell array, spin transfer torque (STT) memory cell array, to name a few, or any combination thereof.

Second semiconductor structure 104 can be a DRAM device in which memory cells are provided in the form of an array of DRAM cells. In some implementations, each DRAM cell includes a capacitor for storing a bit of data as a positive or negative electrical charge as well as one or more transistors (a.k.a. pass transistors) that control (e.g., switch and selecting) access to it. In some implementations, each DRAM cell is a one-transistor, one-capacitor (1T1C) cell. Since transistors always leak a small amount of charge, the capacitors will slowly discharge, causing information stored in them to drain. As such, a DRAM cell has to be refreshed to retain data, for example, by the peripheral circuit in first semiconductor structure 102, according to some implementation.

As shown in FIG. 1A, memory device 100 further includes a bonding interface 106 vertically between (in the vertical direction, e.g., the Z-direction in FIG. 1A) first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., milli-meter or centimeter-level) chip-to-chip data bus on the circuit board, such as printed circuit board (PCB), thereby eliminating chip interface delay and achieving high-speed I/O throughput with reduced power consumption. Data transfer between the memory cell array in second semicon-ductor structure 104 and the peripheral circuits in first semiconductor structure 102 can be performed through the interconnects (e.g., bonding contacts) across bonding inter-face 106. By vertically integrating first and second semi-conductor structures 102 and 104, the chip size can be reduced, and the memory cell density can be increased.

Figure 1B:
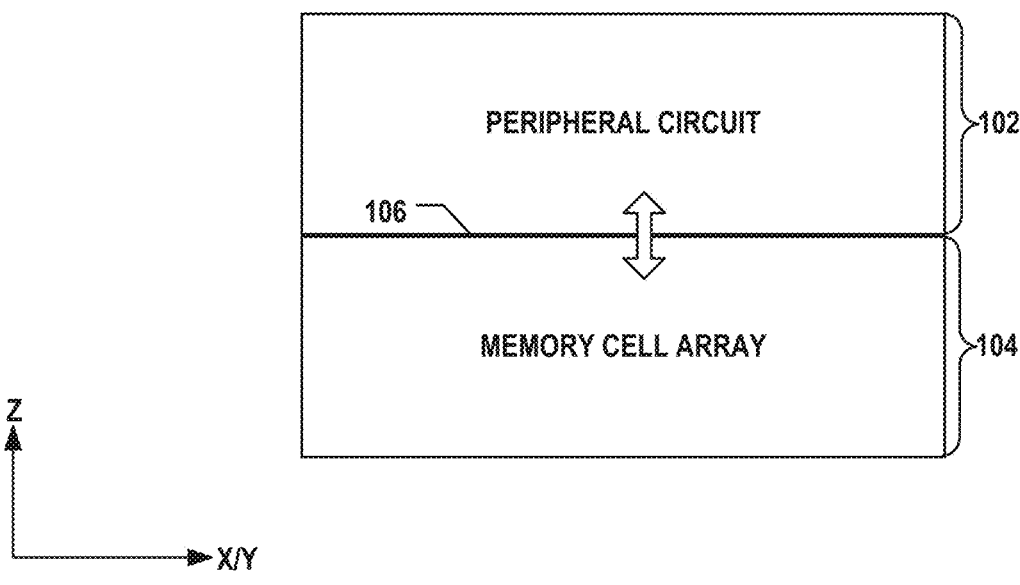
FIG. 1B illustrates a schematic view of a cross-section of another memory device, according to some aspects of the present disclosure.

It is understood that the relative positions of stacked first and second semiconductor structures 102 and 104 are not limited. FIG. 1B illustrates a schematic view of a cross-section of another exemplary memory device 101, according to some implementations. Different from memory device 100 in FIG. 1A in which second semiconductor structure 104 including the memory cell array is above first semiconductor structure 102 including the peripheral circuits, in memory device 101 in FIG. 1B, first semiconductor structure 102 including the peripheral circuit is above second semicon-ductor structure 104 including the memory cell array. Nev-ertheless, bonding interface 106 is formed vertically between first and second semiconductor structures 102 and 104 in memory device 101, and first and second semicon-ductor structures 102 and 104 are jointed vertically through bonding (e.g., hybrid bonding) according to some imple-mentations. Hybrid bonding, also known as "metal/dielec-tric hybrid bonding," is a direct bonding technology (e.g., forming bonding between surfaces without using interme-diate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array in second semiconductor structure 104 and the peripheral circuits in first semiconductor structure 102 can be per-formed through the interconnects (e.g., bonding contacts) across bonding interface 106.

It is noted that X, Y, and Z axes are included in FIGS. 1A and 1B to further illustrate the spatial relationship of the components in memory devices 100 and 101. The substrate of the memory device includes two lateral surfaces extend-ing laterally in the X-Y plane: a top surface on the front side of the wafer on which the semiconductor devices can be formed, and a bottom surface on the backside opposite to the front side of the wafer. The Z-axis is perpendicular to both the X and Y axes. As used herein, whether one component (e.g., a layer or a device) is "on," "above," or "below" another component (e.g., a layer or a device) of the memory device is determined relative to the substrate of the memory device in the Z-direction (the vertical direction perpendicu-lar to the X-Y plane, e.g., the thickness direction of the substrate) when the substrate is positioned in the lowest plane of the memory device in the Z-direction. The same notion for describing the spatial relationships is applied throughout the present disclosure.

Figure 2:
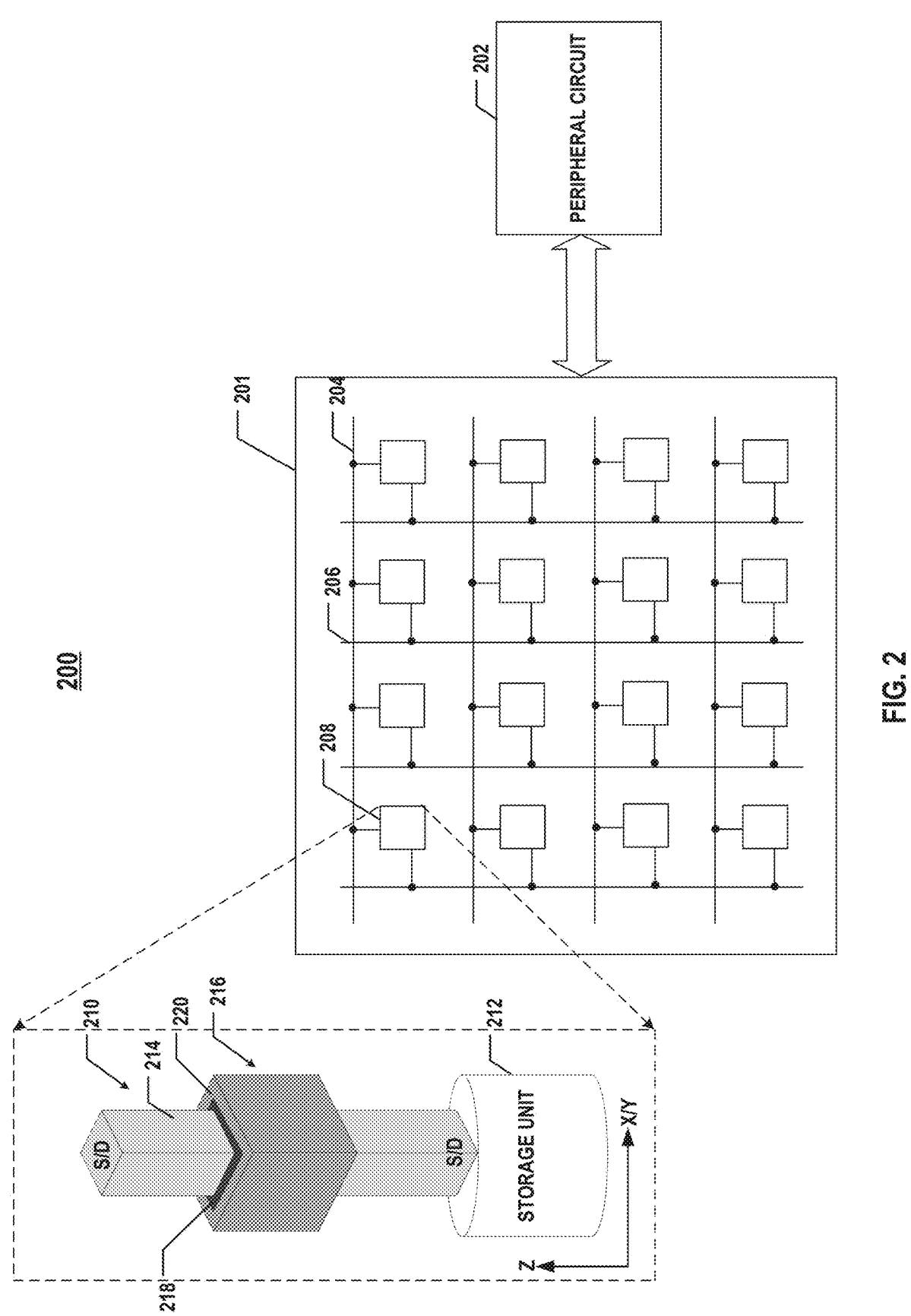
FIG. 2 illustrates a schematic diagram of a memory device including peripheral circuits and an array of memory cells each having a vertical transistor, according to some aspects of the present disclosure.

FIG. 2 illustrates a schematic diagram of a memory device 200 including peripheral circuits and an array of memory cells each having a vertical transistor, according to some aspects of the present disclosure. Memory device 200 can include a memory cell array 201 and peripheral circuits 202 coupled to memory cell array 201. Memory devices 100 and 101 may be examples of memory device 200 in which memory cell array 201 and peripheral circuits 202 may be included in second and first semiconductor structures 104 and 102, respectively. Memory cell array 201 can be any suitable memory cell array in which each memory cell 208 includes a vertical transistor 210 and a storage unit 212 coupled to vertical transistor 210. In some implementations, memory cell array 201 is a DRAM cell array, and storage unit 212 is a capacitor for storing charge as the binary information stored by the respective DRAM cell. In some implementations, memory cell array 201 is a PCM cell array, and storage unit 212 is a PCM element (e.g., including chalcogenide alloys) for storing binary information of the respective PCM cell based on the different resistivities of the PCM element in the amorphous phase and the crystalline phase. In some implementations, memory cell array 201 is a FRAM cell array, and storage unit 212 is a ferroelectric capacitor for storing binary information of the respective FRAM cell based on the switch between two polarization states of ferroelectric materials under an external electric field.

As shown in FIG. 2, memory cells 208 can be arranged in a two-dimensional (2D) array having rows and columns. Memory device 200 can include word lines 204 coupling peripheral circuits 202 and memory cell array 201 for controlling the switch of vertical transistors 210 in memory cells 208 located in a row, as well as bit lines 206 coupling peripheral circuits 202 and memory cell array 201 for sending data to and/or receiving data from memory cells 208 located in a column. That is, each word line 204 is coupled to a respective row of memory cells 208, and each bit line is coupled to a respective column of memory cells 208.

Consistent with the scope of the present disclosure, ver-tical transistors 210, such as vertical metal-oxide-semicon-ductor field-effect transistors (MOSFETs), can replace the planar transistors as the pass transistors of memory cells 208 to reduce the area occupied by the pass transistors, the coupling capacitance, as well as the interconnect routing complexity, as described below in detail. As shown in FIG. 2, in some implementations, different from planar transistors in which the active regions are formed in the substrates, vertical transistor 210 includes a semiconductor body 214 extending vertically (in the Z-direction) above the substrate (not shown). That is, semiconductor body 214 can extend above the top surface of the substrate to allow channels to be formed not only at the top surface of semiconductor body 214, but also at one or more side surfaces thereof. As shown in FIG. 2, for example, semiconductor body 214 can have a cuboid shape to expose four sides thereof. It is understood that semiconductor body 214 may have any suitable 3D shape, such as polyhedron shapes or a cylinder shape. That is, the cross-section of semiconductor body 214 in the plan view (e.g., in the X-Y plane) can have a square shape, a rectangular shape (or a trapezoidal shape), a circular (or an oval shape), or any other suitable shapes. It is understood that consistent with the scope of the present disclosure, for semiconductor bodies that have a circular or oval shape of their cross-sections in the plan view, the semiconductor bodies may still be considered as having multiple sides, such that the gate structures are in contact with more than one side of the semiconductor bodies. As described below with respect to the fabrication process, semiconductor body 214 can be formed from the substrate (e.g., by etching or epitaxy) and thus, has the same semiconductor material (e.g., silicon crystalline silicon) as the substrate (e.g., a silicon substrate).

As shown in FIG. 2, vertical transistor 210 can also include a gate structure 216 in contact with one or more sides of semiconductor body 214, e.g., in one or more planes of the side surface(s) of the active region. In other words, the active region of vertical transistor 210, e.g., semiconductor body 214, can be at least partially surrounded by gate structure 216. Gate structure 216 can include a gate dielectric 218 over one or more sides of semiconductor body 214, e.g., in contact with four side surfaces of semiconductor body 214, as shown in FIG. 2. Gate structure 216 can also include a gate electrode 220 over and in contact with gate dielectric 218. Gate dielectric 218 can include any suitable dielectric materials, such as silicon oxide, silicon nitride, silicon oxynitride, or high-k dielectrics. For example, gate dielectric 218 may include silicon oxide, which is a form of gate oxide. Gate electrode 220 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 220 may include doped polysilicon, which is a form of a gate poly. In some implementations, gate electrode 220 includes multiple conductive layers, such as a W layer over a TiN layer. It is understood that gate electrode 220 and word line 204 may be a continuous conductive structure in some examples. In other words, gate electrode 220 may be viewed as part of word line 204 that forms gate structure 216, or word line 204 may be viewed as the extension of gate electrode 220 to be coupled to peripheral circuits 202.

As shown in FIG. 2, vertical transistor 210 can further include a pair of a source and a drain (S/D, dope regions, a.k.a., source electrode and drain electrode) formed at the two ends of semiconductor body 214 in the vertical direction (the z-direction), respectively. The source and drain can be doped with any suitable P-type dopants, such as boron (B) or Gallium (Ga), or any suitable N-type dopants, such as phosphorus (P) or arsenic (As). The source and drain can be separated by gate structure 216 in the vertical direction (the z-direction). In other words, gate structure 216 is formed vertically between the source and drain. As a result, one or more channels (not shown) of vertical transistor 210 can be formed in semiconductor body 214 vertically between the source and drain when a gate voltage applied to gate electrode 220 of gate structure 216 is above the threshold voltage of vertical transistor 210. That is, each channel of vertical transistors 210 is also formed in the vertical direction along which semiconductor body 214 extends, according to some implementations.

In some implementations, as shown in FIG. 2, vertical transistor 210 is a multi-gate transistor. That is, gate structure 216 can be in contact with more than one side of semiconductor body 214 (e.g., four sides in FIG. 2) to form more than one gate, such that more than one channel can be formed between the source and drain in operation. That is, different from the planar transistor that includes only a single planar gate (and resulting in a single planar channel), vertical transistor 210 shown in FIG. 2 can include multiple vertical gates on multiple sides of semiconductor body 214 due to the 3D structure of semiconductor body 214 and gate structure 216 that surrounds the multiple sides of semiconductor body 214. As a result, compared with planar transistors, vertical transistor 210 shown in FIG. 2 can have a larger gate control area to achieve better channel control with a smaller subthreshold swing. Since the channel is fully depleted, the leakage current (Ioff) of vertical transistor 210 can be significantly reduced as well. As described below in detail, the multi-gate vertical transistors can include double-gate vertical transistors (e.g., dual-side gate vertical transistors), tri-gate vertical transistors (e.g., tri-side gate vertical transistors), and GAA vertical transistors.

It is understood that although vertical transistor 210 is shown as a multi-gate transistor in FIG. 2, the vertical transistors disclosed herein may also include single-gate transistors as described below in detail. That is, gate structure 216 may be in contact with a single side of semiconductor body 214, for example, for the purpose of increasing the transistor and memory cell density. It is also understood that although gate dielectric 218 is shown as being separate (a separate structure) from other gate dielectrics of adjacent vertical transistors (not shown), gate dielectric 218 may be part of a continuous dielectric layer having multiple gate dielectrics of vertical transistors.

In planar transistors and some lateral multiple-gate transistors (e.g., FinFET), the active regions, such as semiconductor bodies (e.g., Fins), extend laterally (in the X-Y plane), and the source and the drain are disposed at different locations in the same lateral plane (the X-Y plane). In contrast, in vertical transistor 210, semiconductor body 214 extends vertically (in the Z-direction), and the source and the drain are disposed in the different lateral planes, according to some implementations. In some implementations, the source and the drain are formed at two ends of semiconductor body 214 in the vertical direction (the Z-direction), respectively, thereby being overlapped in the plan view. As a result, the area (in the X-Y plane) occupied by vertical transistor 210 can be reduced compared with planar transistor and lateral multiple-gate transistors. Also, the metal wiring coupled to vertical transistors 210 can be simplified as well since the interconnects can be routed in different planes. For example, bit lines 206 and storage units 212 may be formed on opposite sides of vertical transistor 210. In one example, bit line 206 may be coupled to the source or the drain at the upper end of semiconductor body 214, while storage unit 212 may be coupled to the other source or the drain at the lower end of semiconductor body 214.

As shown in FIG. 2, storage unit 212 can be coupled to the source or the drain of vertical transistor 210. Storage unit 212 can include any devices that are capable of storing binary data (e.g., 0 and 1), including but not limited to, capacitors for DRAM cells and FRAM cells, and PCM elements for PCM cells. In some implementations, vertical transistor 210 controls the selection and/or the state switch of the respective storage unit 212 coupled to vertical transistor 210.

Figure 3:
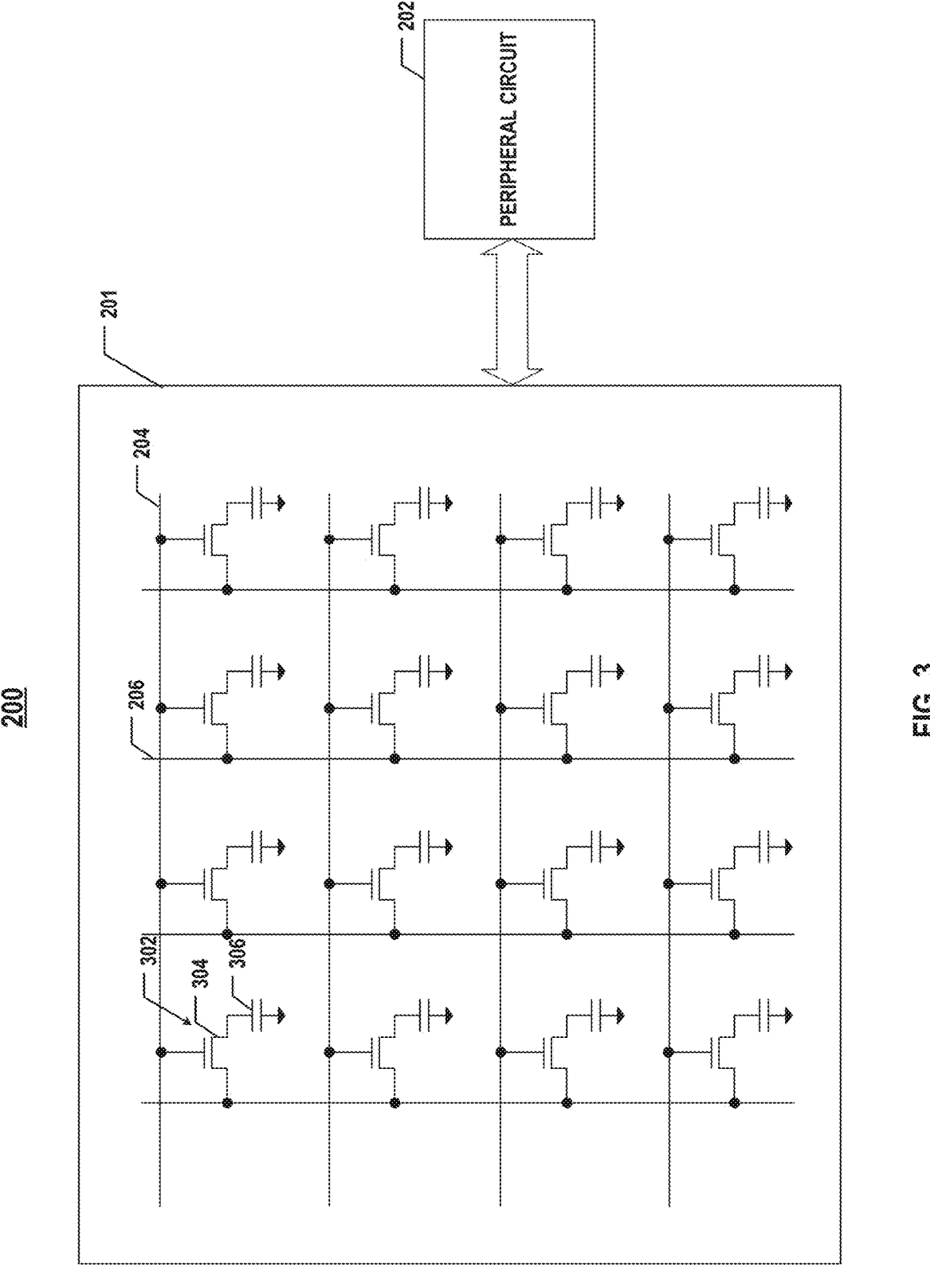
FIG. 3 illustrates a schematic circuit diagram of a memory device including peripheral circuits and an array of dynamic random-access memory (DRAM) cells, according to some aspects of the present disclosure.

FIG. 3 illustrates a schematic diagram of memory device 200 including peripheral circuits and an array of memory cells each having a vertical transistor, according to some aspects of the present disclosure. In some implementations as shown in FIG. 3, each memory cell 208 is a DRAM cell 302 including a transistor 304 (e.g., implementing using vertical transistors 210 in FIG. 2) and a capacitor 306 (e.g., an example of storage unit 212 in FIG. 2). The gate of transistor 304 (e.g., corresponding to gate electrode 220) may be coupled to word line 204, one of the source and the drain of transistor 304 may be coupled to bit line 206, the other one of the source and the drain of transistor 304 may be coupled to one electrode of capacitor 306, and the other electrode of capacitor 306 may be coupled to the ground.

Figure 4:
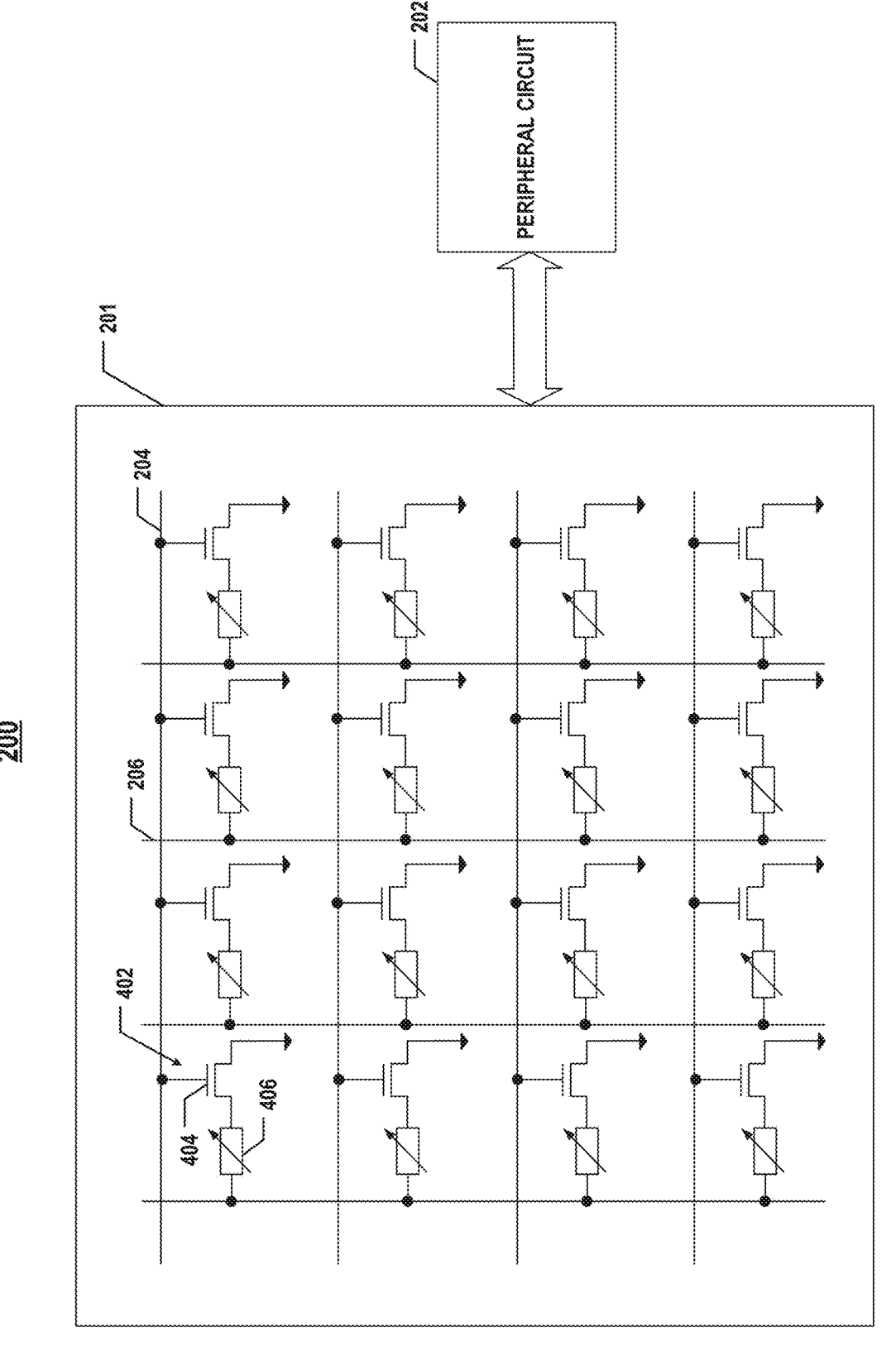
FIG. 4 illustrates a schematic circuit diagram of a memory device including peripheral circuits and an array of phase-change memory (PCM) cells, according to some aspects of the present disclosure.

FIG. 4 illustrates a schematic diagram of memory device 200 including peripheral circuits and an array of memory cells each having a vertical transistor, according to some aspects of the present disclosure. In some implementations as shown in FIG. 4, each memory cell 208 is a PCM cell 402 including a transistor 404 (e.g., implementing using vertical transistors 210 in FIG. 2) and a PCM element 406 (e.g., an example of storage unit 212 in FIG. 2). The gate of transistor 404 (e.g., corresponding to gate electrode 220) may be coupled to word line 204, one of the source and the drain of transistor 404 may be coupled to the ground, the other one of the source and the drain of transistor 404 may be coupled to one electrode of PCM element 406, and the other electrode of PCM element 406 may be coupled to bit line 206.

Figure 5:
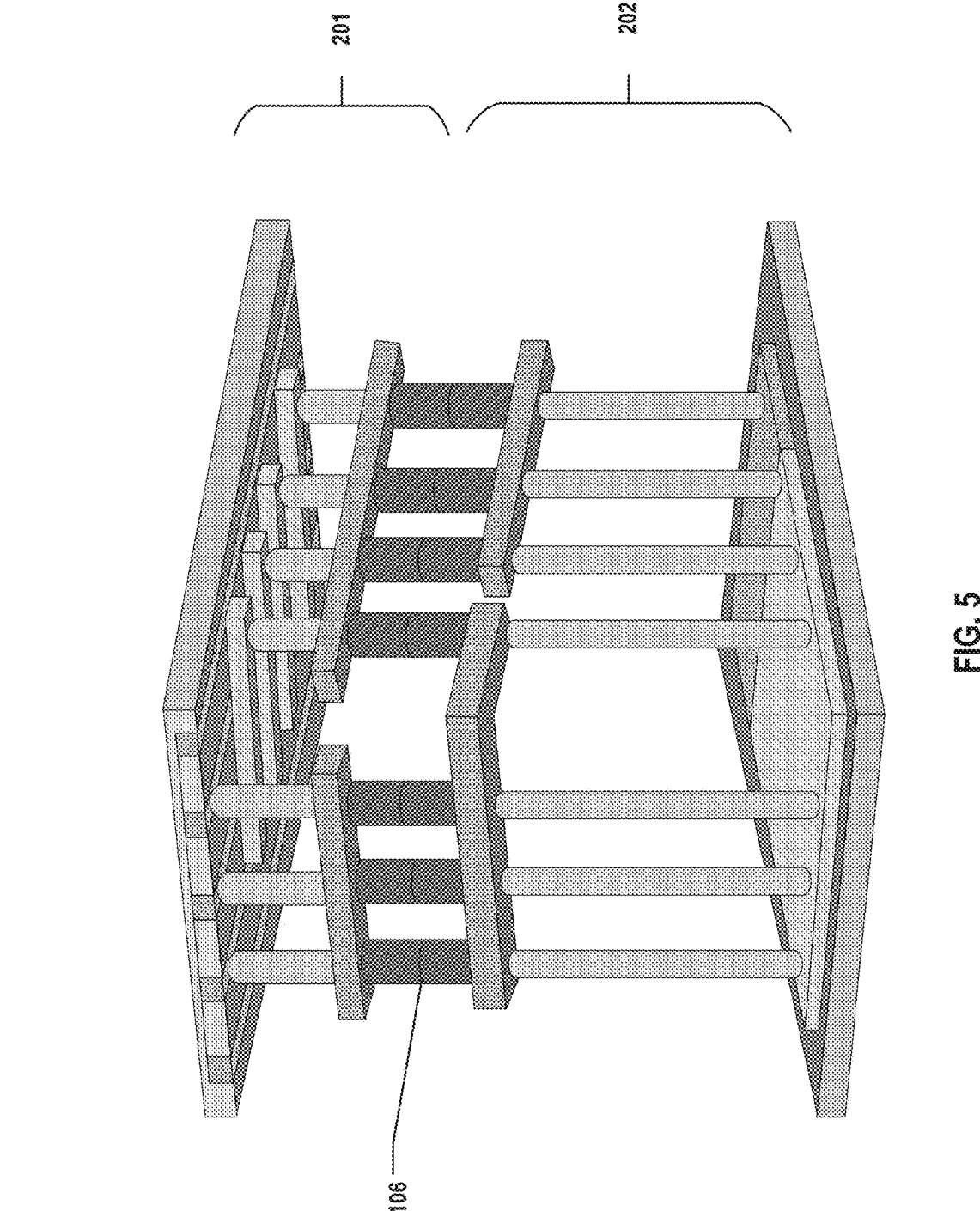
FIG. 5 illustrates a schematic diagram of a perspective view of a memory device, according to some aspects of the present disclosure.

FIG. 5 illustrates a schematic diagram of a perspective view of memory device 200, according to some aspects of the present disclosure. As shown in FIG. 5, memory device 200 includes memory cell array 201 and peripheral circuits 202 coupled to memory cell array 201. A large number of interconnects (e.g., bonding contacts) can be formed through bonding interface 106 to make direct, short-distance (e.g., micron-level) electrical connections between memory cell array 201 and peripheral circuits 202. During the back end of line (BEOL) process of first semiconductor structure 102 including peripheral circuits 202 and second semiconductor structure 104 including memory cell array 201, the interconnects may be formed on bonding interface 106 to bond two wafers together. In some implementations, the conductive layers, e.g., the metal layers, of word lines 204 and bit lines 206 of memory cell array 201 may be connected to the word line driver (WLD), the sense amplifier (SA), and other related circuits of peripheral circuits 202 through the interconnects formed on bonding interface 106.

Figure 6:
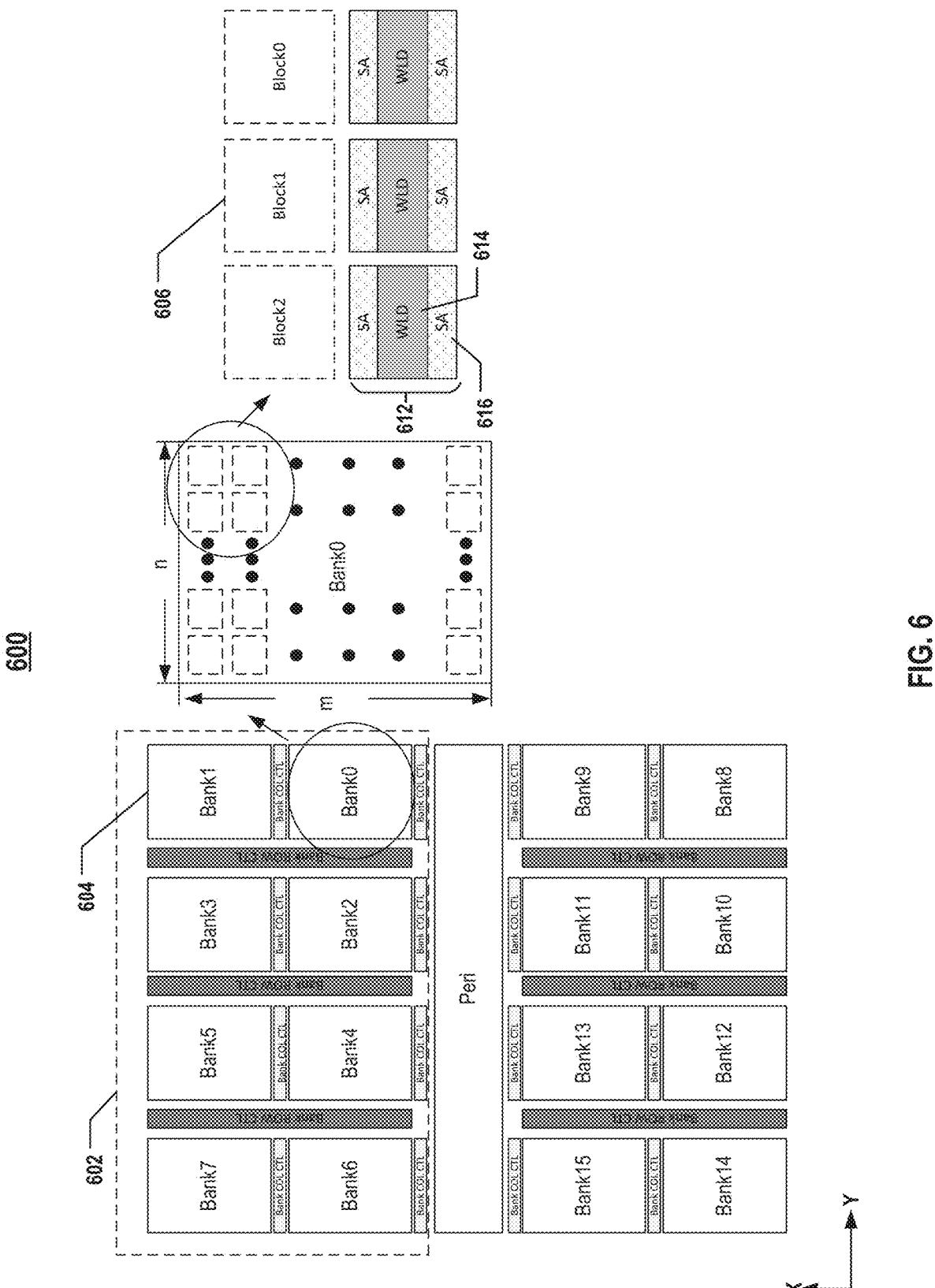
FIG. 6 illustrates a schematic view of a plan view of a memory device, according to some aspects of the present disclosure.

FIG. 6 illustrates a schematic view of a plan view of a memory device 600, according to some aspects of the present disclosure. As shown in FIG. 6, memory device 600 may include one or more than one memory array structure 602, e.g., memory die. Each memory array structure 602 may include a plurality of memory banks 604. For example, as shown in FIG. 6, memory array structure 602 may include 8 memory banks 604. Each memory bank 604 may include a plurality of memory blocks 606. For example, as shown in FIG. 6, memory bank 604 may include (n×m) memory blocks 606.

In some implementations, memory device 600 may further include a plurality of peripheral structures 612. In some implementations, each peripheral structure 612 may include at least one word line driver circuit (WLD circuit) 614 and at least one sense amplifier circuit (SA circuit) 616. In some implementations, as shown in FIG. 6, peripheral structure 612 may include one WLD circuit 614 and two SA circuits 616. It is noted that, in FIG. 6, memory block 606 and peripheral structure 612 are illustrated side-by-side to explain the size of the area covered by memory block 606 and peripheral structure 612. However, in the actual structure, in the plan view of memory device 600, memory block 606 and peripheral structure 612 may at least partially overlap each other. In some implementations, memory block 606 and peripheral structure 612 are individually formed on two different wafers or substrates and are bonded to each other with the at least a partially overlapping relationship. In some implementations, memory block 606 and peripheral structure 612 may fully overlap with each other.

In some implementations, peripheral structure 612 is formed on a first wafer and one peripheral structure 612 occupies a first area on the first wafer in a plan view of the first wafer. In some implementations, memory blocks 606 are formed on a second wafer and one memory block 606 occupies a second area on the second wafer in a plan view of the second wafer. After bonding the first wafer with the second wafer, the first area including WLD circuit 614 and SA circuit 616 at least partially overlaps the second area including memory block 606 in a plan view of memory device 600. In some implementations, the first area may include a first subarea having one WLD circuit 614 and two second subareas each having one SA circuit 616. In some implementations, the two second subareas may be disposed on two sides of the first subarea. In other words, two SA circuits 616 may be disposed on two sides of one WLD circuit 614, as shown in FIG. 6.

In some implementations, when one memory block 606 includes M word lines and N bit lines, WLD circuit 614 may be used to control M word lines in the corresponding memory block 606, and each SA circuit 616 disposed on one side of WLD circuit 614 may be used to control N/2 bit line in the corresponding memory block 606. In some implementations, SA circuit 616 may be shared by two adjacent memory blocks 606, and one SA circuit 616 may be used to control odd or even bit lines in two adjacent memory blocks 606.

Figure 7:
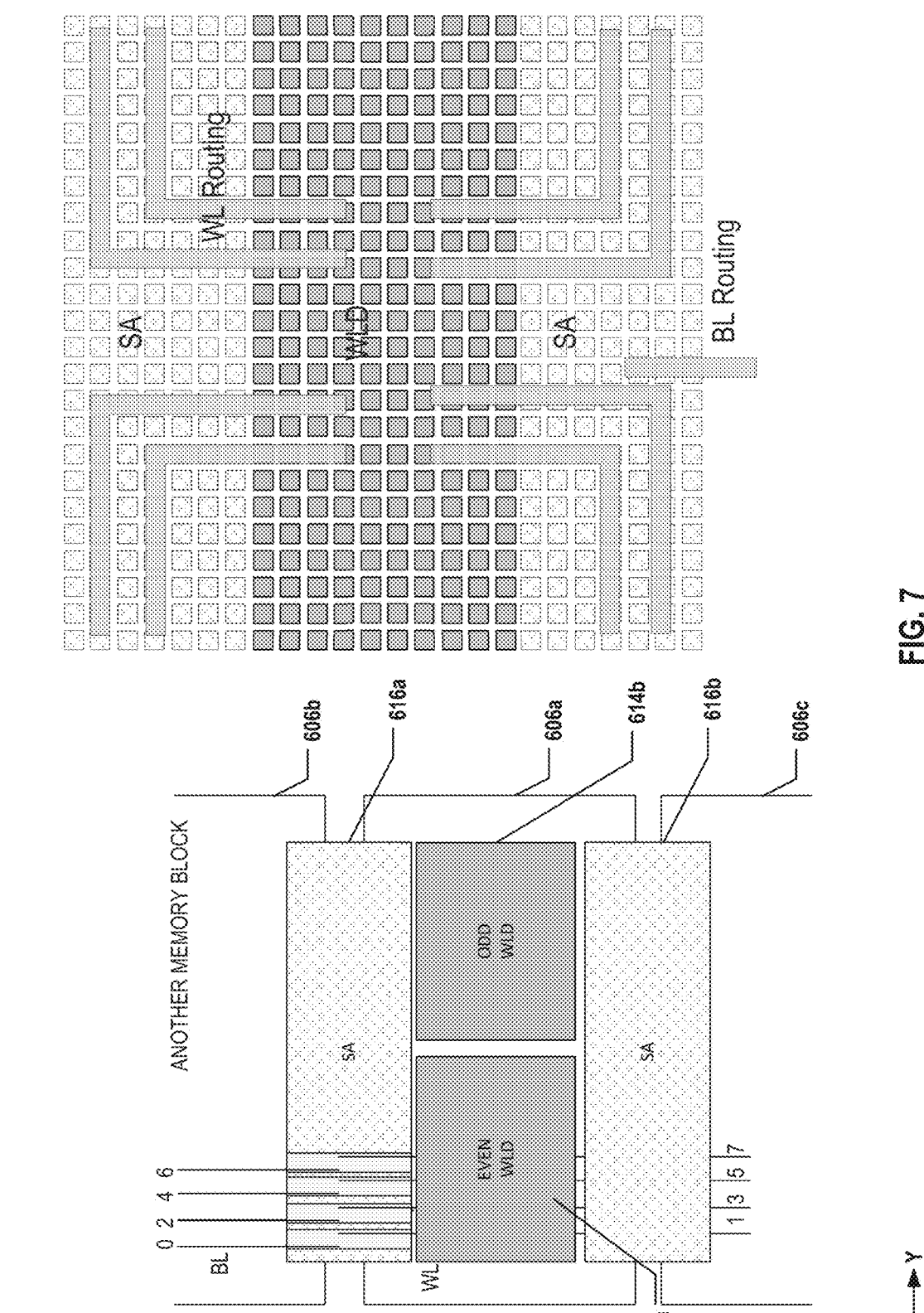
FIG. 7 illustrates a schematic view of an arrangement of a memory device, according to some aspects of the present disclosure.

FIG. 7 illustrates a schematic view of an arrangement of memory device 600, according to some aspects of the present disclosure. As shown in FIG. 7, SA circuit 616 includes a SA circuit 616a and a SA circuit 616b. SA circuit 616a may be used to control even bit lines in memory block 606a and memory block 606b. As shown in FIG. 7, SA circuit 616a includes two outputs: one output is connected to the even bit lines of memory block 606a, and the other output is connected to the even bit lines of memory block 606b above and adjacent to memory block 606a in the X-direction. Similarly, in some implementations, SA circuit 616b includes two outputs: one output is connected to the odd bit lines of memory block 606a, and the other output is connected to the odd bit lines of memory block 606c below and adjacent to memory block 606a in the X-direction.

In some implementations, WLD circuit 614 may further include a WLD circuit 614a and a WLD circuit 614b. In some implementations, WLD circuit 614a may be used to control the even word lines in memory block 606a, and WLD circuit 614b may be used to control the odd word lines in memory block 606a. In some implementations, WLD circuit 614a may be shared by memory block 606a and an adjacent memory block (not shown) disposed on the left side of memory block 606a, and WLD circuit 614b may be shared by memory block 606a and another adjacent memory block (not shown) disposed on the right side of memory block 606a. In some implementations, WLD circuit 614a may be used to control the even word lines in memory block 606a and the even word lines in the adjacent memory block, and WLD circuit 614b may be used to control the odd word lines in memory block 606a and the odd word lines in another adjacent memory block.

In other words, SA circuit 616, including SA circuits 616a and 616b, and WLD circuit 614, including WLD circuits 614a and 614b, may be disposed at least partially overlapping memory block 606a, or fully overlapping memory block 606a. Furthermore, SA circuit 616 and WLD circuit 614 may control memory block 606a alone, or may control memory block 606a and adjacent memory block in the X-direction and/or the Y-direction together.

FIG. 7 further illustrates a schematic view of a word line routing and a bit line routing. As shown in FIG. 7, the word line routing may include both the horizontal direction (the Y-direction) and the vertical direction (the X-direction), and the bit line routing may include merely the vertical direction.

Figure 8:
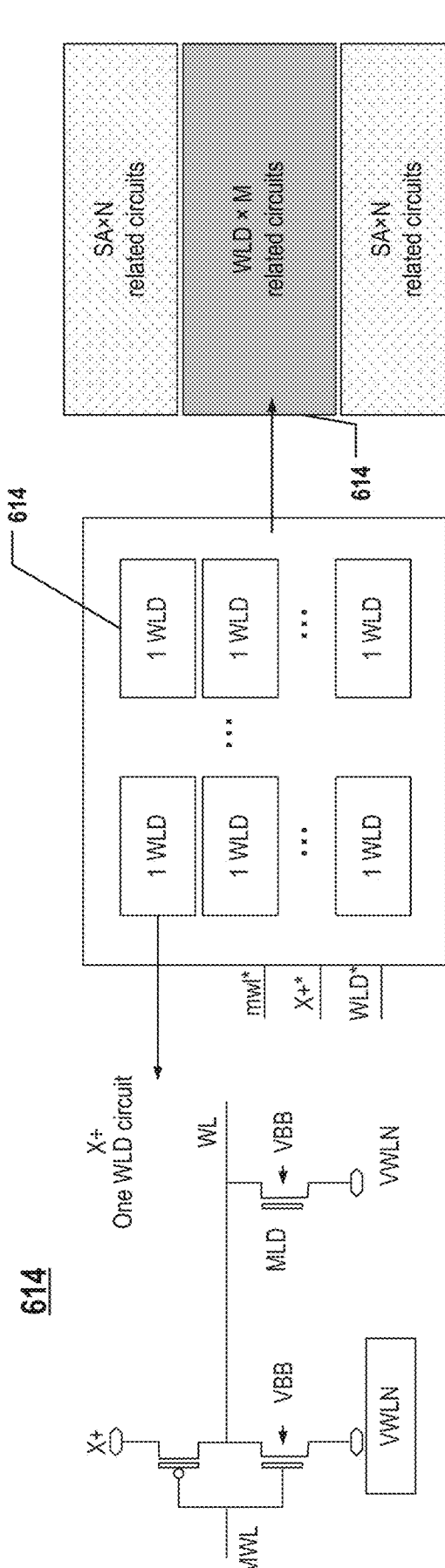
FIG. 8 illustrates a schematic view of a word line driver circuit of a memory device, according to some aspects of the present disclosure.

FIG. 8 illustrates a schematic view of WLD circuit 614 of memory device 600, according to some aspects of the present disclosure, and FIG. 9 illustrates a schematic view of SA circuit 616 of memory device 600, according to some aspects of the present disclosure. It is understood that WLD circuit 614 and SA circuit 616 shown in FIGS. 8 and 9 are for illustration only, and other designs or structures of WLD circuit 614 and SA circuit 616 can also be applied to the current application.

Figure 10:
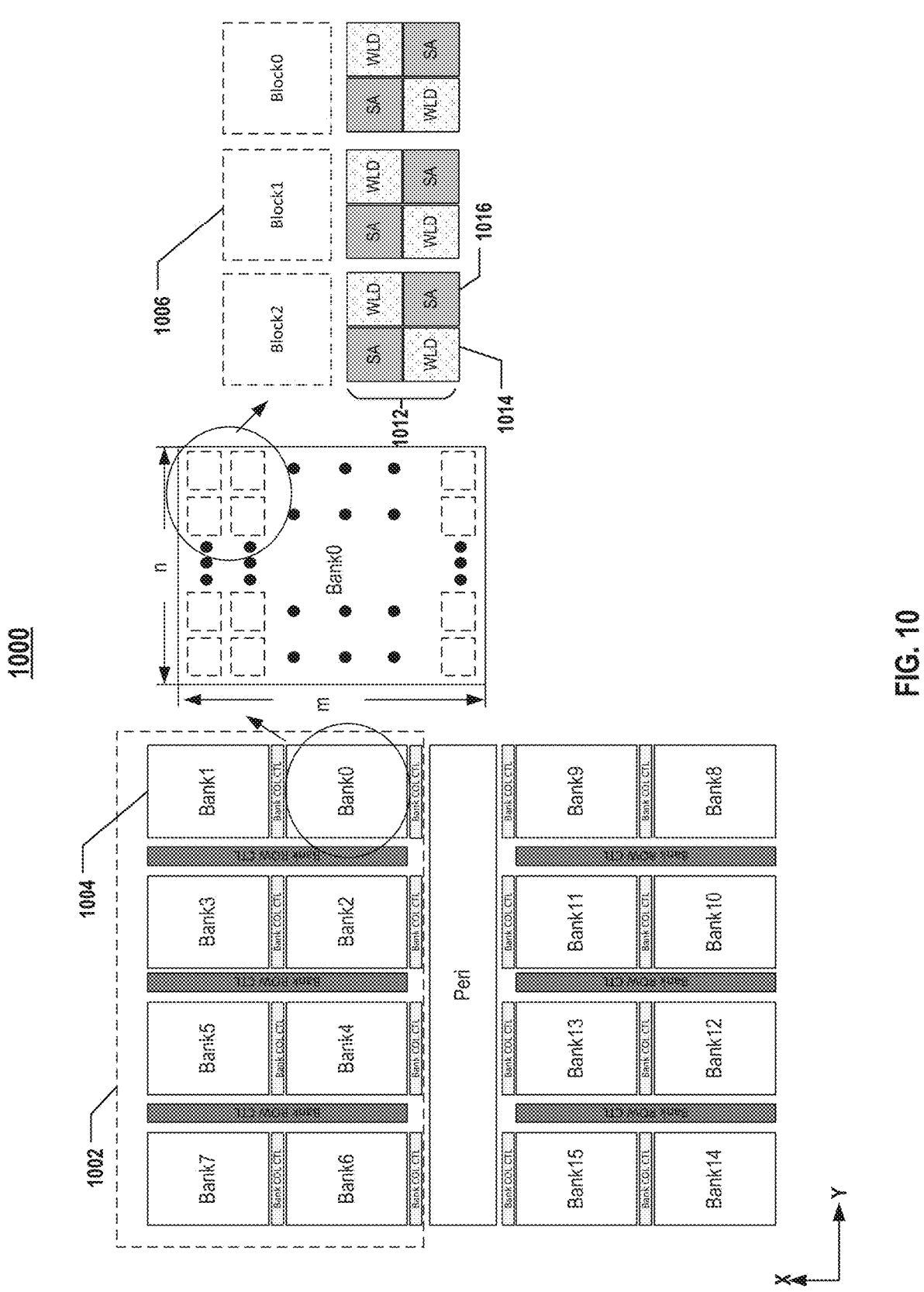
FIG. 10 illustrates a schematic view of a plan view of a memory device, according to some aspects of the present disclosure.

FIG. 10 illustrates a schematic view of a plan view of a memory device 1000, according to some aspects of the present disclosure. As shown in FIG. 10, memory device 1000 may include one or more than one memory array structure 1002, e.g., memory die. Each memory array structure 1002 may include a plurality of memory banks 1004. For example, as shown in FIG. 10, memory array structure 1002 may include 8 memory banks 1004. Each memory bank 1004 may include a plurality of memory blocks 1006. For example, as shown in FIG. 10, memory bank 1004 may include (n×m) memory blocks 1006.

In some implementations, memory device 1000 may further include a plurality of peripheral structures 1012. In some implementations, each peripheral structure 1012 may include at least one word line driver circuit (WLD circuit) 1014 and at least one sense amplifier circuit (SA circuit) 1016. In some implementations, as shown in FIG. 10, peripheral structure 1012 may include two WLD circuits 1014 and two SA circuits 1016. It is noted that, in FIG. 10, memory block 1006 and peripheral structure 1012 are illustrated side-by-side to explain the size of the area covered by memory block 1006 and peripheral structure 1012. However, in the actual application and actual structure, in the plan view of memory device 1000, memory block 1006 and peripheral structure 1012 may at least partially overlap with each other. In some implementations, memory block 1006 and peripheral structure 1012 are individually formed on two different wafers or substrates and are bonded to each other with at least a partially overlapping relationship. In some implementations, memory block 1006 and peripheral structure 1012 may fully overlap with each other.

In some implementations, peripheral structure 1012 is formed on a first wafer and one peripheral structure 1012 occupies a first area on the first wafer in a plan view of the first wafer. In some implementations, memory blocks 1006 are formed on a second wafer and one memory block 1006 occupies a second area on the second wafer in a plan view of the second wafer. After bonding the first wafer with the second wafer, the first area including WLD circuits 1014 and SA circuits 1016 at least partially overlaps the second area including memory block 1006 in a plan view of memory device 1000. In some implementations, the first area may include two first subareas each having one WLD circuit 1014 and two second subareas each having one SA circuit 1016. In some implementations, the first subarea and the second subarea are alternately arranged in the first area, as shown in FIG. 10. In other words, as shown in FIG. 10, the first area (peripheral structure 1012) includes two first subareas (WLD circuit 1014) and two second subareas (SA circuit 1016), two first subareas are disposed on diagonal corners in the first area, and two second subareas are disposed on diagonal corners in the first area.

Figure 11:
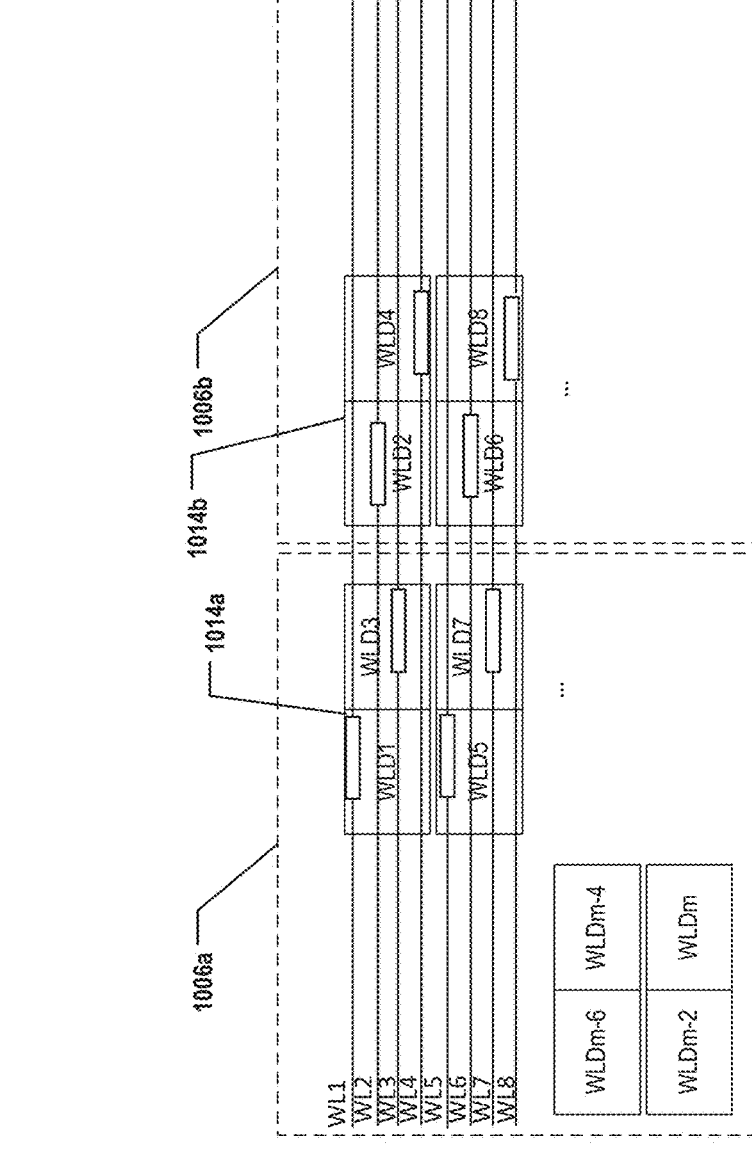
FIG. 11 illustrates a schematic view of an arrangement of a memory device, according to some aspects of the present disclosure.

In some implementations, when one memory block 1006 includes M word lines and N bit lines, one WLD circuit 1014 may be used to control M/4 word lines in the corresponding memory block 1006, and one SA circuit 1016 may be used to control N/2 bit lines in the corresponding memory block 1006. In some implementations, SA circuit 1016 may be shared by two adjacent memory blocks 1006, and one SA circuit 1016 may be used to control odd or even bit lines in two adjacent memory blocks 1006. In some implementations, WLD circuit 1014 may be shared by two adjacent memory blocks 1006, and one WLD circuit 1014 may be used to control odd or even word lines in two adjacent memory blocks 1006, as shown in FIG. 11. In some implementations, WLD circuit 614 and SA circuit 616 shown in FIGS. 8 and 9 may be applied to memory device 1000 as well.

FIG. 11 illustrates a schematic view of an arrangement of memory device 1000, according to some aspects of the present disclosure. As shown in FIG. 11, memory blocks 1006a and 1006b are two adjacent memory blocks. WLD circuit 1014a is located on a peripheral wafer, e.g., the CMOS wafer, corresponding to the position of memory block 1006a on a memory array wafer. WLD circuit 1014a provides corresponding signals to the odd word lines (WL1, WL3, WL5, and WL7) of two memory blocks 1006a and 1006b. WLD circuit 1014b is located on the peripheral wafer, e.g., the CMOS wafer, corresponding to the position of memory block 1006b on a memory array wafer. WLD circuit 1014b provides corresponding signals to the even word lines (WL2, WL4, WL6, and WL8) of two memory blocks 1006a and 1006b. It is understood that the number of word lines or the number of word line drivers in each WLD circuit 1014 is for illustration only, and the actual routing pattern may be different.

Figure 12:
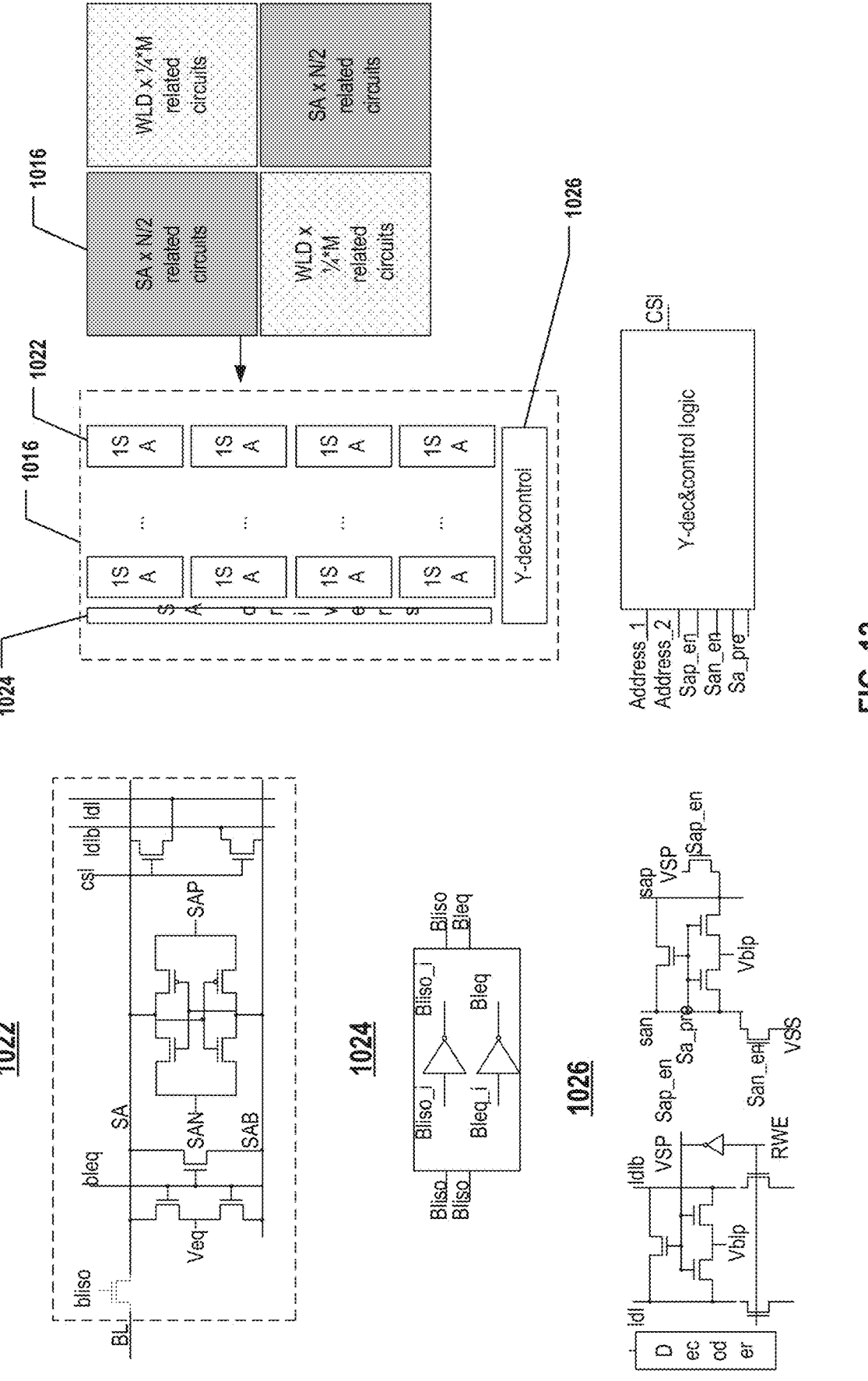
FIG. 12 illustrates a schematic view of a sense amplifier circuit of a memory device, according to some aspects of the present disclosure.

FIG. 12 illustrates a schematic view of SA circuit 1016 of memory device 1000, according to some aspects of the present disclosure. As shown in FIG. 12, one SA circuit 1016 may include a plurality of sense amplifiers 1022, at least one sense amplifier driver 1024, and at least one decoder and control logic 1026. In some implementations, SA circuit 1016 may control only one memory block, e.g., memory block 1006a. In some implementations, two SA circuits 1016 in peripheral structure 1012 may each control N/2 bit lines of memory block 1006.

Figure 13:
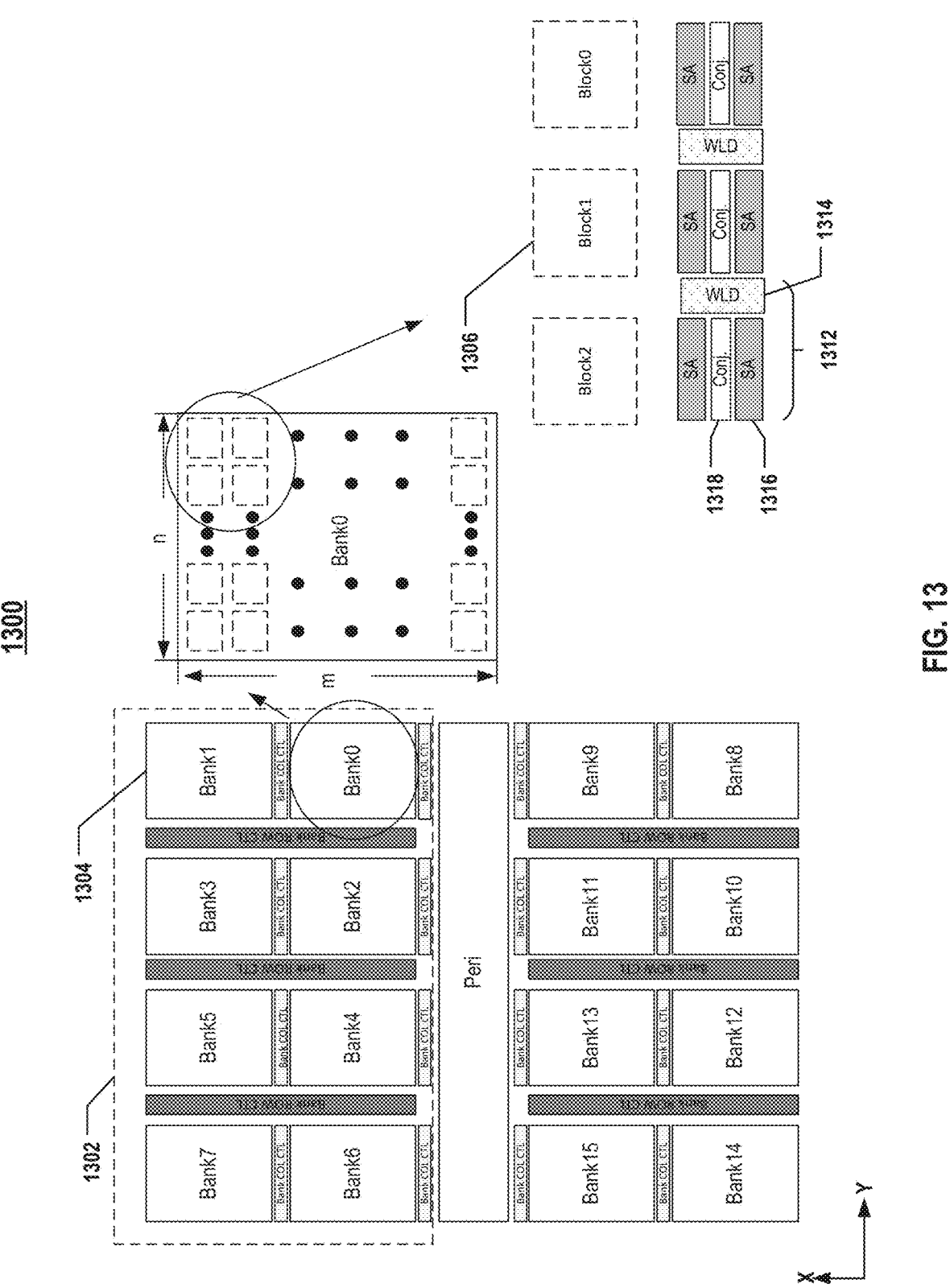
FIG. 13 illustrates a schematic view of a plan view of a memory device, according to some aspects of the present disclosure.

FIG. 13 illustrates a schematic view of a plan view of a memory device 1300, according to some aspects of the present disclosure. As shown in FIG. 13, memory device 1300 may include one or more than one memory array structure 1302, e.g., memory die. Each memory array structure 1302 may include a plurality of memory banks 1304. For example, as shown in FIG. 13, memory array structure 1302 may include 8 memory banks 1304. Each memory bank 1304 may include a plurality of memory blocks 1306. For example, as shown in FIG. 13, memory bank 1304 may include (n×m) memory blocks 1306.

In some implementations, memory device 1300 may further include a plurality of peripheral structures 1312. In some implementations, each peripheral structure 1312 may include at least one word line driver circuit (WLD circuit) 1314 and at least one sense amplifier circuit (SA circuit) 1316. In some implementations, as shown in FIG. 13, peripheral structure 1312 may include one WLD circuit 1314 and two SA circuits 1316. It is noted that, in FIG. 13, memory block 1306 and peripheral structure 1312 are illustrated side-by-side to explain the size of the area covered by memory block 1306 and peripheral structure 1312. However, in the actual application and actual structure, in the plan view of memory device 1300, memory block 1306 and peripheral structure 1312 may at least partially overlap each other. In some implementations, memory block 1306 and peripheral structure 1312 are individually formed on two different wafers or substrates and are bonded to each other with the at least partially overlapping relationship.

In some implementations, peripheral structure 1312 is formed on a first wafer, and one peripheral structure 1312 occupies a first area on the first wafer in a plan view of the first wafer. In some implementations, memory blocks 1306 are formed on a second wafer, and one memory block 1306 occupies a second area on the second wafer in a plan view of the second wafer. After bonding the first wafer with the second wafer, the first area including WLD circuit 1314 and SA circuits 1316 at least partially overlaps the second area including memory block 1306 in a plan view of memory device 1300. In some implementations, the first area may include one first subarea having one WLD circuit 1314 and two second subareas each having one SA circuit 1316. In some implementations, the first subarea having one WLD circuit 1314 may locate between two adjacent memory blocks 1306. In some implementations, the first subarea may not overlap the second area having memory block 1306. In some implementations, the second subareas each having one SA circuit 1316 may at least partially overlap with the second area having memory block 1306. In some implementations, the second subareas may fully overlap with the second area having memory block 1306. In some implementations, SA circuit 1316 may be shared by two adjacent memory blocks 1306, and one SA circuit 1316 may be used to control odd or even bit lines in two adjacent memory blocks 1306. For example, SA circuit 1316 may include two outputs: one output is connected to the even bit lines of memory block 1306, and the other output is connected to the even bit lines of a memory block adjacent to memory block 1306 in the X-direction. In some implementations, WLD circuit 614 and SA circuit 616 shown in FIGS. 8 and 9 may be applied to memory device 1300 as well.

In some implementations, WLD circuit 1314 is located on a peripheral wafer, e.g., the CMOS wafer, corresponding to the position between two memory blocks 1306 on a memory array wafer. In some implementations, WLD circuit 1314 provides corresponding signals to the odd word lines or the even word lines of two adjacent memory blocks 1306. For example, WLD circuit 1314 may provide corresponding signals to the odd word lines of two adjacent memory blocks 1306.

In some implementations, peripheral structure 1312 may further include a conjunction circuit 1318 including control circuits for SA circuit 1316. FIG. 14 illustrates a schematic view of conjunction circuit 1318 of memory device 1300, according to some aspects of the present disclosure. In some implementations, conjunction circuit 1318 occupies a third subarea in the first area. In some implementations, the third subarea is disposed between two second subareas. In some implementations, conjunction circuit 1318 may include at least three portions, including data line circuit (DL/LDL circuit) 1322 for transmitting data outward from the bit lines to the data lines, switch circuit 1324 for generating switching voltage and control timing sequence of the switching operation, and sense amplifier driver (SA driver) 1326 for generating SA related control signals. It is understood that DL/LDL circuit 1322, switch circuit 1324, and SA driver 1326 shown in FIG. 14 are for illustration purposes and other circuit structures may be applied to the current application as well.

Figure 15:
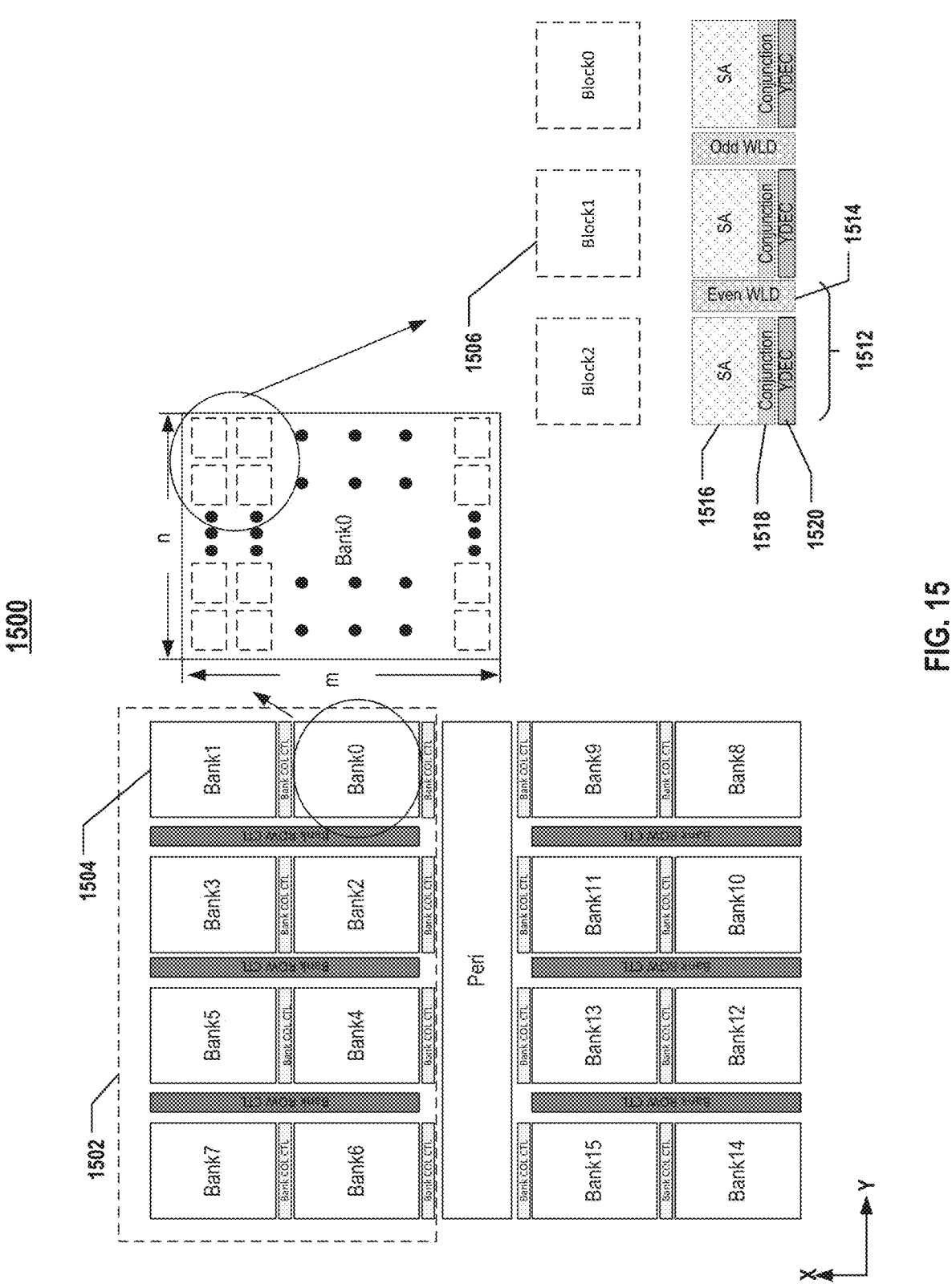
FIG. 15 illustrates a schematic view of a plan view of a memory device, according to some aspects of the present disclosure.

FIG. 15 illustrates a schematic view of a plan view of a memory device 1500, according to some aspects of the present disclosure. As shown in FIG. 15, memory device 1500 may include one or more than one memory array structure 1502, e.g., memory die. Each memory array structure 1502 may include a plurality of memory banks 1504. For example, as shown in FIG. 15, memory array structure 1502 may include 8 memory banks 1504. Each memory bank 1504 may include a plurality of memory blocks 1506. For example, as shown in FIG. 15, memory bank 1504 may include (n×m) memory blocks 1506.

In some implementations, memory device 1500 may further include a plurality of peripheral structures 1512. In some implementations, each peripheral structure 1512 may include at least one word line driver circuit (WLD circuit) 1514 and at least one sense amplifier circuit (SA circuit) 1516. In some implementations, as shown in FIG. 15, peripheral structure 1512 may include one WLD circuits 1514 and one SA circuit 1516. It is noted that, in FIG. 15, memory block 1506 and peripheral structure 1512 are illustrated side-by-side to explain the size of the area covered by memory block 1506 and peripheral structure 1512. However, in the actual application and actual structure, in the plan view of memory device 1500, memory block 1506 and peripheral structure 1512 may at least partially overlap with each other. In some implementations, memory block 1506 and peripheral structure 1512 are individually formed on two different wafers or substrates and are bonded to each other with at least a partially overlapping relationship.

In some implementations, peripheral structure 1512 is formed on a first wafer, and one peripheral structure 1512 occupies a first area on the first wafer in a plan view of the first wafer. In some implementations, memory blocks 1506 are formed on a second wafer, and one memory block 1506 occupies a second area on the second wafer in a plan view of the second wafer. After bonding the first wafer with the second wafer, the first area including WLD circuit 1514 and SA circuits 1516 at least partially overlaps the second area including memory block 1506 in a plan view of memory device 1500. In some implementations, the first area may include one first subarea having one WLD circuit 1514 and one second subarea each having one SA circuit 1516. In some implementations, the first subarea having one WLD circuit 1514 may locate between two adjacent memory blocks 1506. In some implementations, the first subarea may not overlap the second area having memory block 1506. In some implementations, the second subarea having one SA circuit 1516 may at least partially overlap the second area having memory block 1506. In some implementations, the second subarea may fully overlap the second area having memory block 1506. In some implementations, WLD circuit 614 and SA circuit 616 shown in FIGS. 8 and 9 may be applied to memory device 1500 as well.

Figure 16:
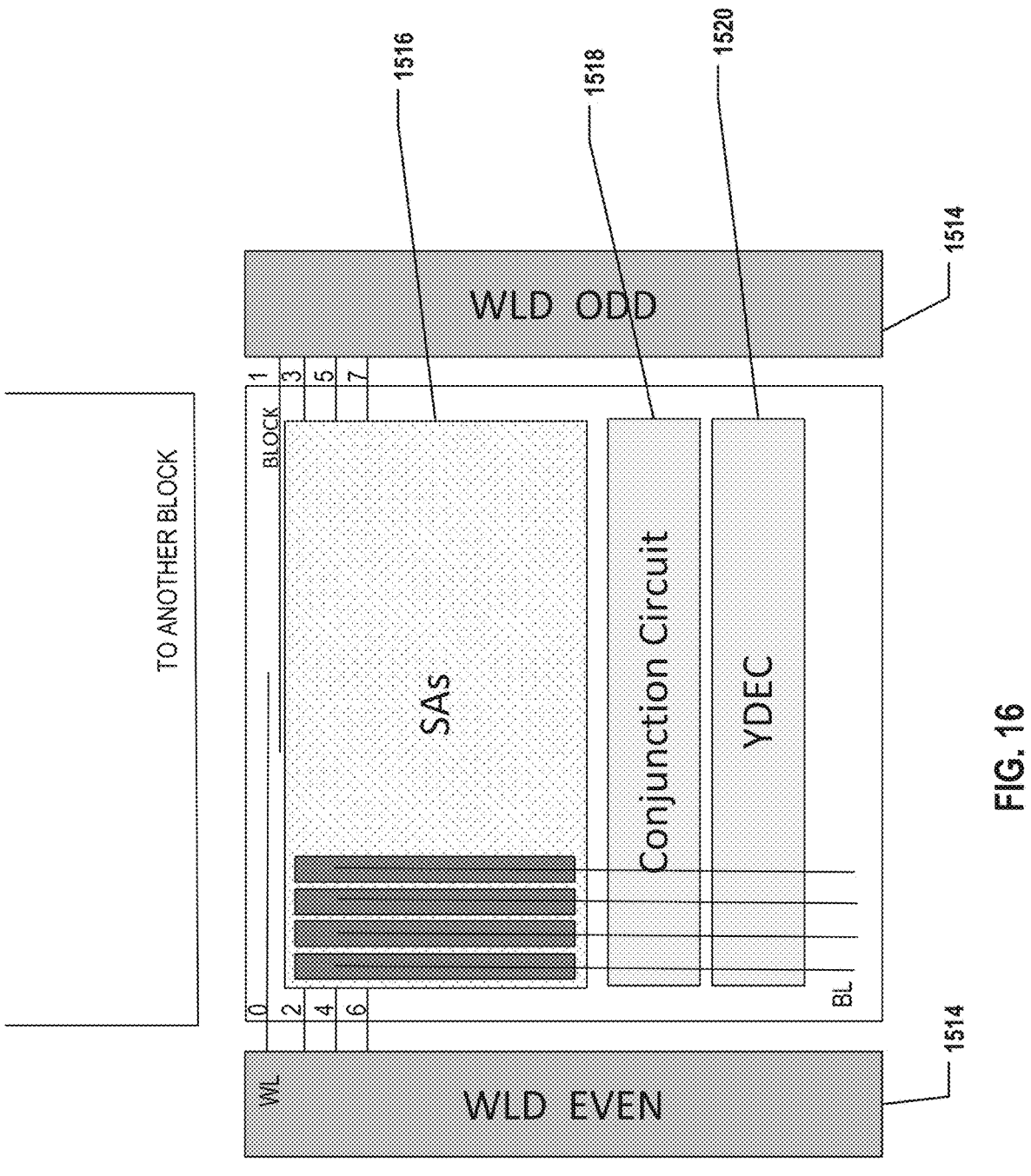
FIG. 16 illustrates a schematic view of a plan view of a peripheral circuit, according to some aspects of the present disclosure.
Figure 17:
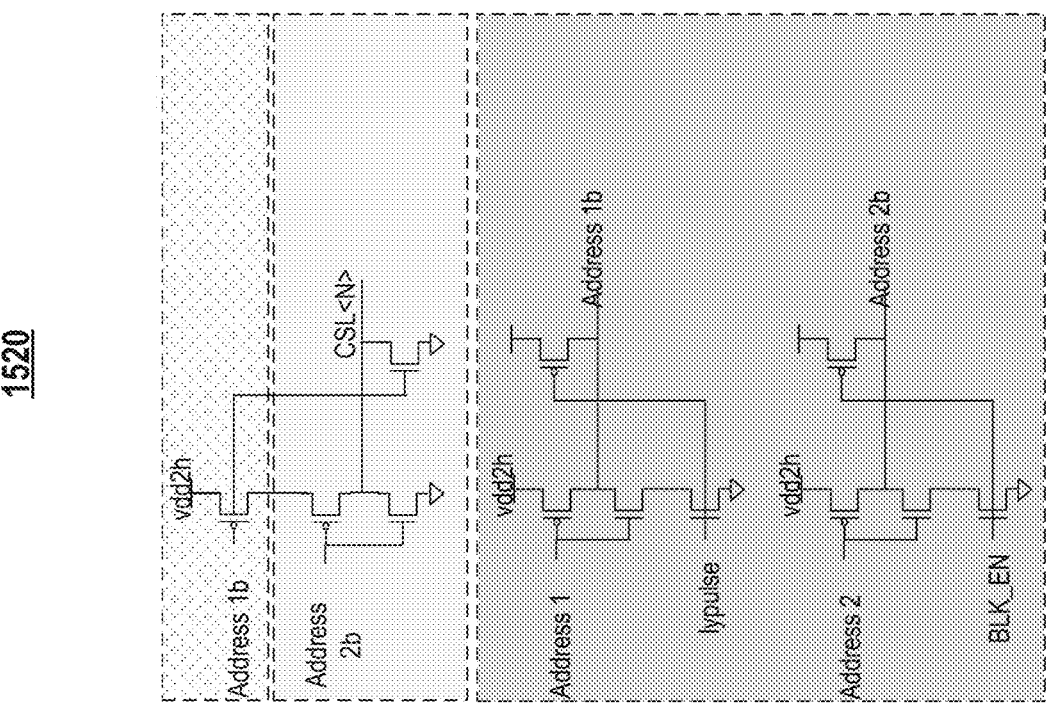
FIG. 17 illustrates a schematic view of a decoder and control logic of a memory device, according to some aspects of the present disclosure.

FIG. 16 illustrates a schematic view of a plan view of peripheral structure 1512, according to some aspects of the present disclosure. In some implementations, WLD circuit 1514 is located on a peripheral wafer, e.g., the CMOS wafer, corresponding to the position between two memory blocks 1506 on a memory array wafer. In some implementations, WLD circuit 1514 provides corresponding signals to the odd word lines or the even word lines of two adjacent memory blocks 1506. For example, as shown in FIGS. 15 and 16, odd WLD circuit 1514 may provide corresponding signals to the odd word lines of two adjacent memory blocks 1506, and even WLD circuit 1514 may provide corresponding signals to the even word lines of two adjacent memory blocks 1506.

In some implementations, peripheral structure 1512 may further include a conjunction circuit 1518. In some implementations, conjunction circuit 1518 occupies a third subarea in the first area. In some implementations, the third subarea is disposed next to the first subarea. In some implementations, conjunction circuit 1318 shown in FIG. 14 may be applied to memory device 1500 as well.

In some implementations, peripheral structure 1512 may further include a decoder and control logic 1520. FIG. 16 illustrates a schematic view of decoder and control logic 1520 of memory device 1500, according to some aspects of the present disclosure. In some implementations, decoder and control logic 1520 may decode the address of the word lines in the Y-direction. It is understood that decoder and control logic 1520 shown in FIG. 16 are for illustration purposes and other circuit structure may be applied to the current application as well.

By using memory devices 600, 1000, 1300, or 1500, the memory array and the peripheral circuits of the memory device can be formed on two different wafers, respectively and then bonded together. In this way, the peripheral circuits including the WLD circuit, the SA circuit, the conjunction circuit, and/or the decoder and control logic may be hidden below the memory arrays. Hence, the size of memory devices 600, 1000, 1300, or 1500 may be reduced, and the array efficiency may also be improved.

FIG. 18 illustrates a flowchart of a method 1800 for forming a memory device, according to some aspects of the present disclosure. As shown in operation 1802 in FIG. 18, a memory array structure is formed on a first substrate, e.g., a first wafer. The memory array structure may include at least one memory bank, and each memory bank may include a plurality of memory blocks. In some implementations, the memory array structure can use transistors as the switch and selecting devices. In some implementations, the memory array structure includes an array of DRAM cells. For ease of description, a DRAM cell array may be used as an example for describing the memory cell array in the present disclosure. But it is understood that the memory cell array is not limited to DRAM cell array and may include any other suitable types of memory cell arrays that can use transistors as the switch and selecting devices, such as PCM cell array, SRAM cell array, FRAM cell array, resistive memory cell array, magnetic memory cell array, STT memory cell array, to name a few, or any combination thereof.

In some implementations, each DRAM cell includes a capacitor for storing a bit of data as a positive or negative electrical charge as well as one or more transistors (a.k.a. pass transistors) that control (e.g., switch and selecting) access to it. In some implementations, each DRAM cell is a one-transistor, one-capacitor (1T1C) cell. Since transistors always leak a small amount of charge, the capacitors will slowly discharge, causing information stored in them to drain. As such, a DRAM cell has to be refreshed to retain data, for example, by the peripheral circuit.

As shown in operation 1804 in FIG. 18, a peripheral structure having the peripheral circuits is formed on a second substrate, e.g., a second wafer, different from the first substrate. The peripheral structure may include a word line driver circuit and a sense amplifier circuit. In some implementations, the peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits on the second substrate use CMOS technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in operation 1806 in FIG. 18, the memory array structure and the peripheral structure are bonded to have the word line driver circuit and the sense amplifier circuit at least partially overlap a memory block in a plan view of the memory device.

In some implementations, the word line driver circuit is formed on the second substrate in a first subarea, and the sense amplifier circuit is formed on the second substrate in a second subarea. In some implementations, the first subarea and the second subarea are disposed on diagonal corners of the memory block in the plan view of the memory device, as shown in FIG. 10.

In some implementations, the word line driver circuit is formed on the second substrate in a first subarea, and the sense amplifier circuit is formed on the second substrate in a second subarea and a third subarea. In some implementations, the second subarea and the third subarea are disposed on two sides of the first subarea in the plan view of the memory device, as shown in FIG. 6.

In some implementations, the first subarea is disposed between adjacent memory blocks in the plan view of the memory device, and the second subarea and the third subarea are disposed overlapping the memory block in the plan view of the memory device, as shown in FIG. 13.

In some implementations, the word line driver circuit is formed on the second substrate in a first subarea, the sense amplifier circuit is formed on the second substrate in a second subarea, and a decoder circuit is formed on the second substrate in a third subarea. In some implementations, the first subarea is disposed between adjacent memory blocks in the plan view of the memory device, and the second subarea and the third subarea are disposed overlapping the memory block in the plan view of the memory device, as shown in FIG. 15.

Figure 19:
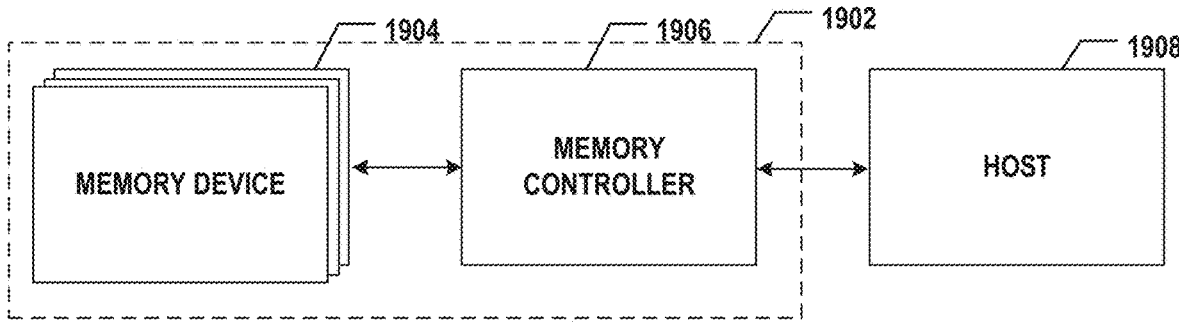
FIG. 19 illustrates a block diagram of an exemplary system having a memory device, according to some aspects of the present disclosure.

FIG. 19 illustrates a block diagram of a system 1900 having a memory device, according to some aspects of the present disclosure. System 1900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 19, system 1900 can include a host 1908 and a memory system 1902 having one or more memory devices 1904 and a memory controller 1906. Host 1908 can be a processor of an electronic device, such as a central processing unit (CPU), or a system-on-chip (SoC), such as an application processor (AP). Host 1908 can be configured to send or receive the data to or from memory devices 1904.

Memory device 1904 can be any memory devices disclosed herein, such as memory devices 600, 1000, 1300, or 1500. In some implementations, memory device 1904 includes an array of memory cells each including a vertical transistor, as described above in detail.

Memory controller 1906 is coupled to memory device 1904 and host 1908 and is configured to control memory device 1904, according to some implementations. Memory controller 1906 can manage the data stored in memory device 1904 and communicate with host 1908. Memory controller 1906 can be configured to control operations of memory device 1904, such as read, write, and refresh operations. Memory controller 1906 can also be configured to manage various functions with respect to the data stored or to be stored in memory device 1904 including, but not limited to refresh and timing control, command/request translation, buffer and schedule, and power management. In some implementations, memory controller 1906 is further configured to determines the maximum memory capacity that the computer system can use, the number of memory banks, memory type and speed, memory particle data depth and data width, and other important parameters. Any other suitable functions may be performed by memory controller 1906 as well. Memory controller 1906 can communicate with an external device (e.g., host 1908) according to a particular communication protocol. For example, memory controller 1906 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The foregoing description of the specific implementations can be readily modified and/or adapted for various applications. Therefore, such adaptations and modifications are intended to be within the meaning and range of equivalents of the disclosed implementations, based on the teaching and guidance presented herein. The breadth and scope of the present disclosure should not be limited by any of the above-described exemplary implementations, but should be defined only in accordance with the following claims and their equivalents.

What is claimed is:

1. A memory device, comprising:
   a memory array structure comprising at least one memory bank, each memory bank comprising a plurality of memory blocks; and
   a peripheral structure comprising a word line driver circuit and a sense amplifier circuit,
   wherein a first area comprising the word line driver circuit and the sense amplifier circuit at least partially overlaps a second area comprising a memory block in a plan view of the memory device; and
   wherein the first area comprises a first subarea comprising the word line driver circuit and two second subareas each comprising the sense amplifier circuit, wherein the two sense amplifier circuits are disposed on two opposite sides of the word line driver circuit, and the word line driver circuit is located on an alignment line of the two sense amplifier circuits in the plan view of the memory device.

2. The memory device of claim 1, wherein the first area completely overlaps the second area in the plan view of the memory device.

3. The memory device of claim 1, wherein the sense amplifier circuit in one of the two second subareas is shared by two adjacent memory blocks.

4. The memory device of claim 1, wherein the sense amplifier circuit in one of the two second subareas is coupled to odd bit lines in the memory block and odd bit lines in a first adjacent memory block, and the sense amplifier circuit in the other of the two second subareas is coupled to even bit lines in the memory block and even bit lines in a second adjacent memory block.

5. The memory device of claim 4, wherein the word line driver circuit in the first subarea is coupled to odd word lines in the memory block and is coupled to even word lines in adjacent memory blocks.

6. The memory device of claim 1, wherein the memory array structure is disposed on a first substrate, and the peripheral structure is disposed on a second substrate different from the first substrate.

7. The memory device of claim 6, wherein the memory array structure disposed on the first substrate is bonded with the peripheral structure disposed on the second substrate.

8. The memory device of claim 7, wherein the memory array structure comprises dynamic random access memory (DRAM).

9. A memory device, comprising:
   a memory array structure comprising at least one memory bank, each memory bank comprising a plurality of memory blocks; and
   a peripheral structure comprising a word line driver circuit and a sense amplifier circuit,
   wherein a first area comprising the word line driver circuit and the sense amplifier circuit at least partially overlaps a second area comprising a memory block in a plan view of the memory device; and
   wherein the first area comprises a first subarea comprising the word line driver circuit, a second subarea comprising the sense amplifier circuit, and a third subarea comprising a decoder circuit, wherein the first subarea is disposed between adjacent memory blocks in the plan view of the memory device, and the second subarea and the third subarea overlap the second area of the memory block in the plan view of the memory device.

10. The memory device of claim 9, wherein the first area further comprises a fourth subarea comprising a control circuit for the sense amplifier circuit, and the fourth subarea is disposed between the second subarea and the third subarea.

11. The memory device of claim 10, wherein the second subarea, the third subarea, and the fourth subarea overlap the second area of the memory block in the plan view of the memory device.

12. A method for forming a memory device, comprising:
   forming a memory array structure on a first substrate, the memory array structure comprising at least one memory bank, each memory bank comprising a plurality of memory blocks;
   forming a peripheral structure on a second substrate different from the first substrate, the peripheral structure comprising a word line driver circuit and two sense amplifier circuits, wherein the two sense amplifier circuits are disposed on two opposite sides of the word line driver circuit, and the word line driver circuit is located on an alignment line of the two sense amplifier circuits in a plan view of the memory device; and
   bonding the memory array structure and the peripheral structure to have the word line driver circuit and the two sense amplifier circuits at least partially overlap a memory block in the plan view of the memory device.

13. The method of claim 12, wherein forming the peripheral structure on the second substrate, comprises:
   forming the word line driver circuit in a first subarea and the two sense amplifier circuits in two second subareas.

14. The method of claim 12, wherein forming the peripheral structure on the second substrate, comprises:
   forming the word line driver circuit in a first subarea and the two sense amplifier circuits in a second subarea and a third subarea.

15. The method of claim 12, wherein forming the peripheral structure on the second substrate, comprises:
   forming the word line driver circuit in a first subarea, the two sense amplifier circuits in two second subareas, and a decoder circuit in a third subarea.

16. The method of claim 15, wherein the sense amplifier circuit in one of the two second subareas is coupled to odd bit lines in the memory block and odd bit lines in a first adjacent memory block, and the sense amplifier circuit in the other of the two second subareas is coupled to even bit lines in the memory block and even bit lines in a second adjacent memory block.

17. The method of claim 15, wherein the word line driver circuit in the first subarea is coupled to odd word lines in the memory block and is coupled to even word lines in adjacent memory blocks.

18. The method of claim 15, wherein bonding the memory array structure and the peripheral structure to have the word line driver circuit and the sense amplifier circuit at least partially overlap the memory block in the plan view of the memory device, comprises:

disposing the first subarea between adjacent memory blocks in the plan view of the memory device, and the second subarea and the third subarea overlapping the memory block in the plan view of the memory device.

19. The method of claim 12, wherein the memory array structure comprises dynamic random access memory (DRAM).

\* \* \* \* \*